United States Patent [19]

DasGupta et al.

[11] Patent Number: 4,503,386

[45] Date of Patent: Mar. 5, 1985

[54] CHIP PARTITIONING AID (CPA)-A STRUCTURE FOR TEST PATTERN GENERATION FOR LARGE LOGIC NETWORKS

[75] Inventors: Sumit DasGupta, Wappingers Falls; Matthew C. Graf, Highland; Robert A. Rasmussen, LaGrangeville, all of N.Y.; Thomas W. Williams, Boulder, Colo.

[73] Assignee: International Business Machines Corporation, Armonk, N.Y.

[21] Appl. No.: 370,214

[22] Filed: Apr. 20, 1982

[51] Int. Cl.$^3$ .............................................. G01R 31/28
[52] U.S. Cl. ................................. 324/73 R; 364/490; 371/27
[58] Field of Search ........................ 324/73 R, 73 AT; 371/15, 27; 364/489, 490, 579, 580

[56] References Cited

U.S. PATENT DOCUMENTS

| | | | |
|---|---|---|---|
| 3,564,114 | 2/1971 | Blinder | 174/68.5 |
| 3,726,002 | 4/1973 | Greenstein et al. | 29/577 |
| 3,746,973 | 7/1973 | McMahon, Jr. | 324/51 |
| 3,761,695 | 9/1973 | Eichelberger | 235/153 |
| 3,781,683 | 12/1973 | Freed | 324/158 |
| 3,783,254 | 1/1974 | Eichelberger | 235/152 |
| 3,784,907 | 1/1974 | Eichelberger | 324/57 |
| 3,789,205 | 1/1974 | James | 235/153 |
| 3,803,483 | 4/1974 | McMahon, Jr. | 324/51 |
| 3,815,025 | 6/1974 | Jordan | 324/73 |
| 3,838,204 | 9/1974 | Ahn et al. | 174/68.5 |
| 3,851,221 | 11/1974 | Beaulieu et al. | 317/100 |
| 3,961,251 | 6/1976 | Hurley et al. | 324/73 |
| 3,961,252 | 6/1976 | Eichelberger et al. | 324/73 |
| 3,961,254 | 6/1976 | Cavaliere et al. | 324/73 |
| 3,993,123 | 11/1976 | Chu et al. | 165/80 |
| 3,999,004 | 12/1976 | Chirino et al. | 174/68.5 |
| 4,006,492 | 2/1977 | Eichelberger et al. | 357/45 |
| 4,051,352 | 9/1977 | Eichelberger et al. | 364/716 |
| 4,051,353 | 9/1977 | Lee | 364/716 |
| 4,063,078 | 12/1977 | Das Gupta et al. | 364/700 |
| 4,063,080 | 12/1977 | Eichelberger et al. | 235/302 |
| 4,071,902 | 1/1978 | Eichelberger et al. | 364/716 |
| 4,138,692 | 2/1979 | Meeker et al. | 357/82 |
| 4,220,917 | 9/1980 | McMahon, Jr. | 324/83 |
| 4,241,307 | 12/1980 | Hong | 324/73 |
| 4,244,048 | 1/1981 | Tsui | 371/15 |
| 4,245,273 | 1/1981 | Feinberg et al. | 361/382 |
| 4,263,965 | 4/1981 | Mansuria et al. | 165/80 |
| 4,293,919 | 10/1981 | Das Gupta et al. | 364/716 |
| 4,298,980 | 11/1981 | Hajdu et al. | 371/25 |
| 4,348,759 | 9/1982 | Schnurmann | 371/20 |

OTHER PUBLICATIONS

"Introduction to an LSI Test System", M. Correia and F. B. Petrini, 14th Design Automation Conference Proceedings, Jun. 20, 21 and 22, 1977, New Orleans, Louisiana, IEEE Catalog Number 77, CH 1216-1C, pp. 460-461.

(List continued on next page.)

*Primary Examiner*—Gerard R. Strecker
*Attorney, Agent, or Firm*—Wesley DeBruin

[57] ABSTRACT

Disclosed is a design discipline, or approach, in the form of circuitry and a test method, or methodology which obviates the problems of the prior art and allows testing of each individual chip and interchip connections of a plurality of interconnected chips contained on or within a high density packaging structure. This testing is accomplished without the need for and utilization of test equipment having a precision probe and a high precision step and repeat mechanism. CPA is a method and circuit design discipline that, where followed, will result in a testable multichip package given that each logical component is testable and the design is synchronous in nature. The CPA discipline is able to accomplish this by making use of shift register latches on the chips or functional island periphery. These latches are used to indirectly observe and/or control the synchronous network, in many ways replicating the stuckfault test environment under which tests were generated at the lower subcomponent level of assembly. One method, full CPA, offers the ability to apply these tests to all full CPA chips on the multichip package simultaneously or in unison, thus reducing manufacturing tester time. An additional benefit is the ease of testing intercomponent connections.

19 Claims, 32 Drawing Figures

OTHER PUBLICATIONS

"A Logic Design Structure for LSI Testability", E. B. Eichelberger and T. W. Williams, 14th Design Automation Conference Proceedings, Jun. 20, 21 and 22, 1977, New Orleans, Louisiana, IEEE Catalog Number 77, CH 1216-1C, pp. 462-468.

"Automatic Checking of Logic Design Structures for Compliance with Testability Ground Rules" by H. C. Godoy, G. B. Franklin and P. S. Borroroff, 14th Design Automation Conference Proceedings, Jun. 20, 21 and 22, 1977, New Orleans, Louisiana, IEEE Catalog Number 77, CH 1216-1C, pp. 469-478.

"Test Generation for Large Logic Networks" by P. S. Bottoroff, R. E. France, N. H. Garges and E. J. Orosz, 14th Design Automation Conference Proceedings, Jun. 20, 21 and 22, 1977, New Orleans, Louisiana, IEEE Catalog Number 77, CH 1216-1C, pp. 479 to 485.

"Delay Test Generation" by E. P. Hsieh, R. A. Rasmussen, L. J. Vidunas and W. T. Davis, 14th Design Automation Conference Proceedings, Jun. 20, 21 and 22, 1977, New Orleans, Louisiana, IEEE Catalog Number 77, CH 1216-1C, pp. 486 to 491.

"Delay Test Simulation" by T. M. Storey and J. W. Barry, 14th Design Automation Conference Proceedings, Jun. 20, 21 and 22, 1977, New Orleans, Louisiana, IEEE Catalog Number 77, CH 1216-1C, pp. 492 to 494.

"Selective Controllability: A Proposal for Testing and Diagnosis" by F. Hsu, P. Solecky and L. Zobniw, 15th Design Automation Conf. Proceedings, Jun. 19, 20 and 21, 1978, Las Vegas, Nevada, IEEE Catalog Number 78 CH 1363-1C, pp. 110-116.

"Testability Considerations in a VLSI Design Automation System" by E. H. Porter (paper 2.3) 1980 IEEE Test Conference, CH 1608-9/80/0000-0026 $00.75.

"Automatic Test Generation Methods for Large Scale Integrated Logic? by E. R. Jones and C. H. Mays, IEEE Journal of Solid-State Circuits, vol. SC-2, No. 4, Dec. 1967, pp. 221-226.

"Techniques for the Diagnosis of Switching Circuit Failures", Proceedings of the 2nd Annual Symposium on Switching Theory and Logic Design, Oct. 1960, pp. 152-160.

"Semiconductor Wafer Testing" by D. E. Shultis, IBM Technical Disclosure Bulletin, vol. 13, No. 7, Dec. 1970, p. 1793.

"Designing LSI Logic for Testability" by E. I. Muehldorf, Digest of Papers 1976, Semiconductor Test Symposium, Memory & LSI, (Oct. 19-21, 1976 held at Cherry Hill, New Jersey) sponsored by IEEE Computer Society and the Philadelphia Section of the IEEE, pp. 45-49.

"Impact of LSI On Complex Digital Circuit Board Testing" by P. S. Bottoroff and E. I. Muhldorf, Testing Complex Digital Assemblies, Session 32, Electro 77 Professional Program Paper 32/3, pp. 1 through 12, New York, Apr. 19-21, 1977, Copyright 1977 Electro.

"Enhancing Testability of Large-Scale Integrated Circuits Via Test Points and Additional Logic" by M. J. Y. Williams et al., IEEE Transactions on Computers vol. C-22, No. 1, Jan. 1973, pp. 46-60.

"Automatic System Level Test Generation and Fault Location For Large Digital Systems" by A. Yamada, et al., 15th Design Automation Conference Proceedings, Jun. 19, 20 and 21, 1978, Las Vegas, Nevada, IEEE Catalog Number 78 CH 1363-1C, pp. 347-352.

"LSI Chip Design for Testability" by S. Das Gupta et al., 1978 IEEE International Solid-State Circuits Conference, Digest of Technical Papers, Feb. 1978, pp. 216 and 217.

"Design for Testability of the IBM System/38" by L. A. Stolte et al., Digest of Papers, 1979, IEEE Test Conference (Oct. 23-25, 1979, Cherry Hill, New Jersey) pp. 29-36.

"Printed Circuit Card Incorporating Circuit Test Register" by E. I. Muehldorf, IBM Technical Disclosure Bulletin, vol. 16, No. 6, Nov. 1973, p. 1732.

"AC Chip In-Place Test" by M. T. McMahon, Jr., IBM Technical Disclosure Bulletin, vol. 17, No. 6, Nov. 1974, pp. 1607-1608.

"Shunting Technique for Testing Electronic Circuitry" R. D. Harrod, IBM Technical Disclosure Bulletin, vol. 18, No. 1, Jun. 1975, pp. 204-205.

"Interconnection Test Arrangement" by J. D. Barnes, IBM Technical Disclosure Bulletin, vol. 22, No. 8B, Jan. 1980, pp. 3679-3680.

"Single Clock Shift Register Latch" by T. W. Williams, IBM Technical Disclosure Bulletin, vol. 16, No. 6, Nov. 1973, p. 1961.

"Trigger Arrays Using Shift Register Latches" by S. Das Gupta, IBM Technical Disclosure Bulletin, vol. 24, No. 1B, Jun. 1981, pp. 615-616.

"Logic-Array Isolation by Testing" by P. Goel, IBM Technical Disclosure Bulletin, vol. 23, No. 7A, Dec. 1980, pp. 2794-2799.

"Functionally Independent A.C. Test for Multi-Chip Packages" by P. Goel and M. T. McMahon, IBM Technical Disclosure Bulletin, vol. 25, No. 5, Oct. 1982, pp. 2308-2310.

"Automated Data Base-Driven Digital Testing" by A. Toth et al., Computer (IEEE Computer Society) vol. 7, No. 1, Jan. 1974, pp. 13-19.

"Shift Register Latch for Package Testing in Minimum Area and Power Dissipation" by E. F. Culican, J. C. Diepenbrock and Y. M. Ting, IBM Technical Disclosure Bulletin, vol. 24, No. 11A, Apr. 1982, pp. 5598-5600.

"Shift Register Latch Driver" by J. C. Diepenbrock, G. J. Gaudenzi and D. C. Reedy, IBM Technical Disclosure Bulletin, vol. 24, No. 11A, Apr. 1982, pp. 5649-5650.

IBM News, Special Edition, Nov. 1980, Copyright 1980 by International Business Machines.

"A Critique of Chip-Joining Techniques" by L. F. Miller, Apr. 1970/Solid State Technology, vol. 13/No. 4, pp. 50-62.

"A Fabrication Technique for Multilayer Ceramic Modules" by H. P. Kaiser et al., Solid State Technology/May 1972, vol. 15, No. 5, pp. 35-40.

"Algorithms for Detection of Faults in Logic Circuits" by W. G. Bouricius et al., Research Report RC 3117 of IBM Thomas J. Watson Research Center, Oct. 19, 1970.

"Diagnosis of Automata Failures A Calculus and a Method" by J. Paul Roth, IBM Journal of Research and Development, Jul. 1966, pp. 278-291.

SYMBOLIC REPRESENTATION OF SHIFT REGISTER LATCH (SRL)

IMPLEMENTATION OF SRL OF FIG. 1 IN AND-INVERT GATES

CHIP WITH THREE INTERCONNECTED SRL'S

FOUR CHIPS ON MODULE WITH INTERCONNECTED SRL'S

EXAMPLE OF SRL WITH L2*

EXAMPLE OF SRL WITH L2* IMPLEMENTED IN AND-INVERT GATES

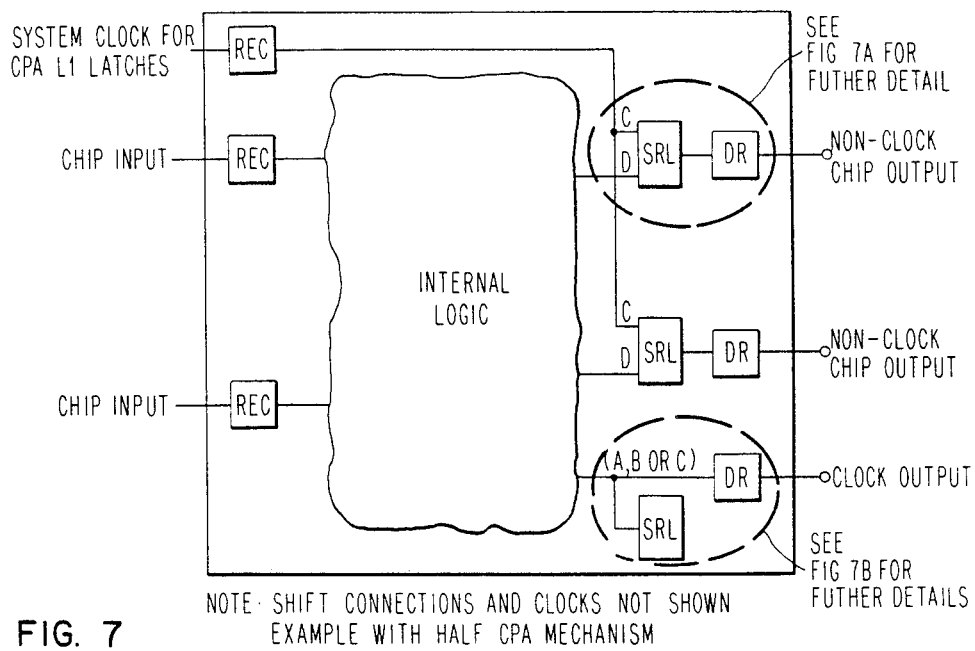
FIG. 7 — NOTE: SHIFT CONNECTIONS AND CLOCKS NOT SHOWN
EXAMPLE WITH HALF CPA MECHANISM
IN FIG. 8 AND 9 "REC" IS RECEIVER CIRCUIT, "DR" IS OFF-CHIP DRIVER CIRCUIT AND "SRL" IS SHIFT REGISTER LATCH
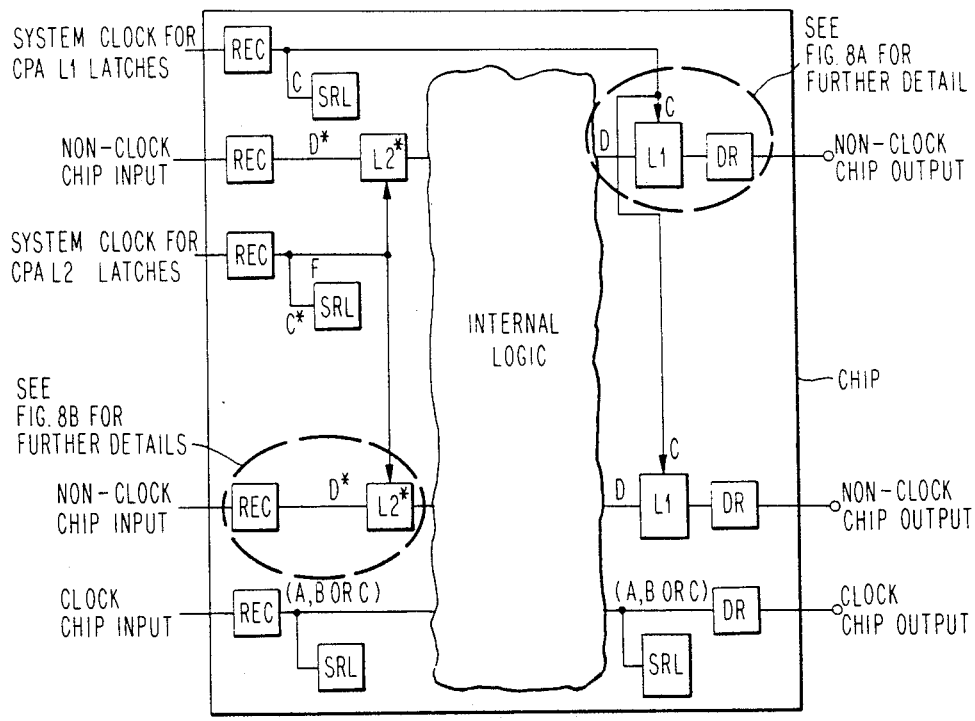
FIG. 8 — NOTE: SHIFT CONNECTIONS AND CLOCKS NOT SHOWN
EXAMPLE OF CHIP WITH FULL CPA MECHANISM

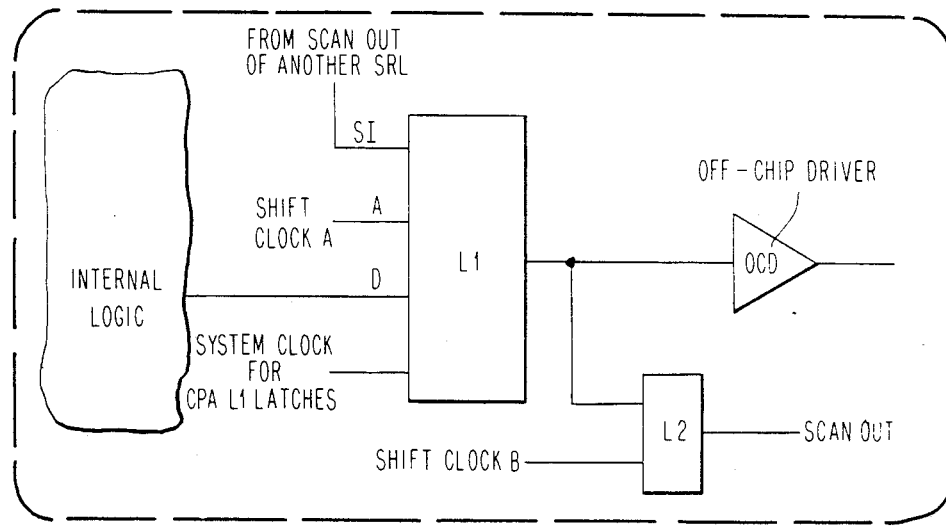
FIG. 7A  EXAMPLE OF CPA L1 LATCH FEEDING OFF-CHIP
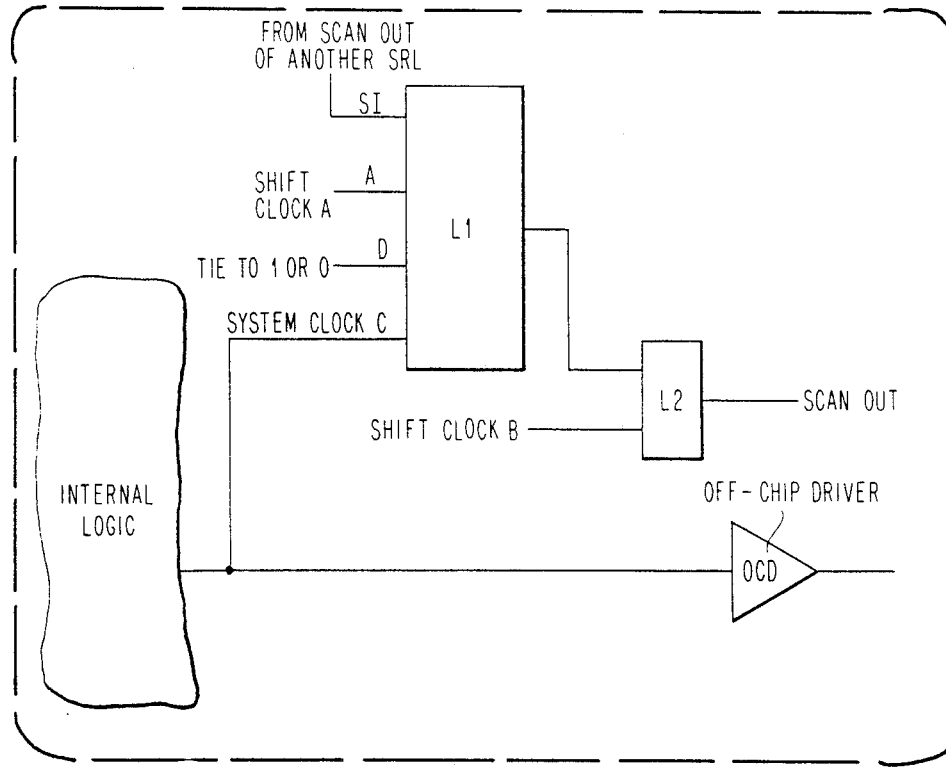
FIG. 7B  EXAMPLE OF SYSTEM CLOCK FEEDING OFF-CHIP

EXAMPLE OF A L1 LATCH FEEDING OFF-CHIP.

EXAMPLE OF L2* LATCHES GATING ON-CHIP DATA

MODULE WITH HALF CPA MECHANISM
(MODULE MAY CONTAIN 100 CHIPS OR MORE)

MODULE WITH FULL CPA MECHANISM
(MODULE MAY CONTAIN 100 CHIPS OR MORE)

FLUSH TEST, LSSD SHIFT REGISTER

SHIFT TEST, LSSD SHIFT REGISTER

"SHIFT TEST" WAVEFORMS FOR SHIFT REGISTER OF FIG. 12

PACKAGE WIRING TEST
NOTE: LSSD SHIFT REGISTER CONNECTIONS, A+B CLOCKS NOT SHOWN

CPASC L2* - APPLIED IN BOTH TEST 1 AND TEST 2
PACKAGE WIRING TEST WITH
NO DOTTING OF CHIP OUTPUTS

NOTE: LSSD SHIFT REGISTER CONNECTIONS, A+B CLOCKS NOT SHOWN

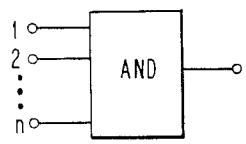
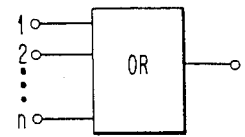
| TEST # | INPUTS | | | | | | OUTPUTS |
|---|---|---|---|---|---|---|---|
| | 1 | 2 | 3 | – | n-1 | n | |
| 1 | 0 | 1 | 1 | | 1 | 1 | 0 |
| 2 | 1 | 0 | 1 | | 1 | 1 | 0 |
| 3 | 1 | 1 | 0 | | 1 | 1 | 0 |
| – | – | – | – | | – | – | – |
| – | – | – | – | | – | – | – |
| – | – | – | – | | – | – | – |
| n | 1 | 1 | 1 | | 1 | 0 | 0 |
| n+1 | 1 | 1 | 1 | | 1 | 1 | 1 |
AND, n-INPUT SEQUENCE
FIG. 16
| TEST # | INPUTS | | | | | | OUTPUTS |
|---|---|---|---|---|---|---|---|
| | 1 | 2 | 3 | – | n-1 | n | |
| 1 | 1 | 0 | 0 | | 0 | 0 | 1 |
| 2 | 0 | 1 | 0 | | – | 0 | 1 |
| 3 | 0 | 0 | 1 | | – | 0 | 1 |
| – | – | – | – | | – | – | – |
| – | – | – | – | | – | – | – |
| – | – | – | – | | – | – | – |
| n | 0 | 0 | 0 | | – | 1 | 1 |
| n+1 | 0 | 0 | 0 | | – | 0 | 0 |
OR, n-INPUT SEQUENCE
FIG. 17
TEST COMBINATIONS FOR DOT CONFIGURATIONS
| TEST # | 1 | 2 | 3 | 4 | | |
|---|---|---|---|---|---|---|
| a | 0 | 1 | 1 | 1 | | |
| b | 1 | 0 | 1 | 1 | g } n=3 |
| c | 1 | 1 | 0 | 1 | | |
| d | 0 | 1 | 1 | X | h } n=2 |
| e | 1 | 0 | 1 | X | | |
| f | 0 | 1 | X | X | i – n=1 | |
INPUTS
n=1, n=2, n=3 DOT CONFIGURATIONS
| TEST # | 1 | 2 | 3 | 4 |
|---|---|---|---|---|
| g | 0 | 0 | 0 | 1 |
| h | 0 | 0 | 1 | X |
| i | 0 | 1 | X | X |
OUTPUTS
DOT AND FUNCTION
FIG. 18

PACKAGE WIRING TEST
(THREE TESTS NEEDED SINCE AT MOST TWO
CHIP OUTPUTS ARE DOTTED TOGETHER)

PACKAGE WIRING TEST (DIAGNOSTIC RESOLUTION)

(THE PORTIONS 1 THROUGH 6 OF THE PACKAGE NET ARE
INDEPENDENTLY DIAGNOSABLE BASED ON OBSERVED VALUES
AT THE PACKAGE OUTPUT PIN AND THE FOUR L2* LATCHES)

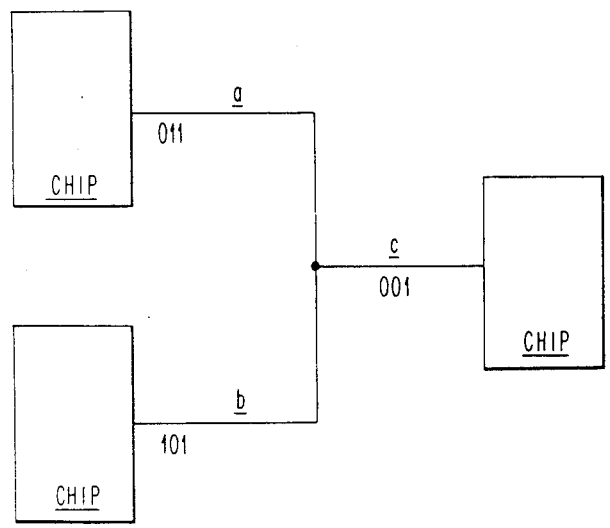
PACKAGE WIRING TEST (DIAGNOSTIC RESOLUTION WITH DOTTING)
FAILURE ON THE THREE TEST SEQUENCE RESULTS IN
DIAGNOSING: PORTION a STUCK AT "1"; PORTION b STUCK AT "1";
PORTION c STUCK AT "0".
FIG. 21
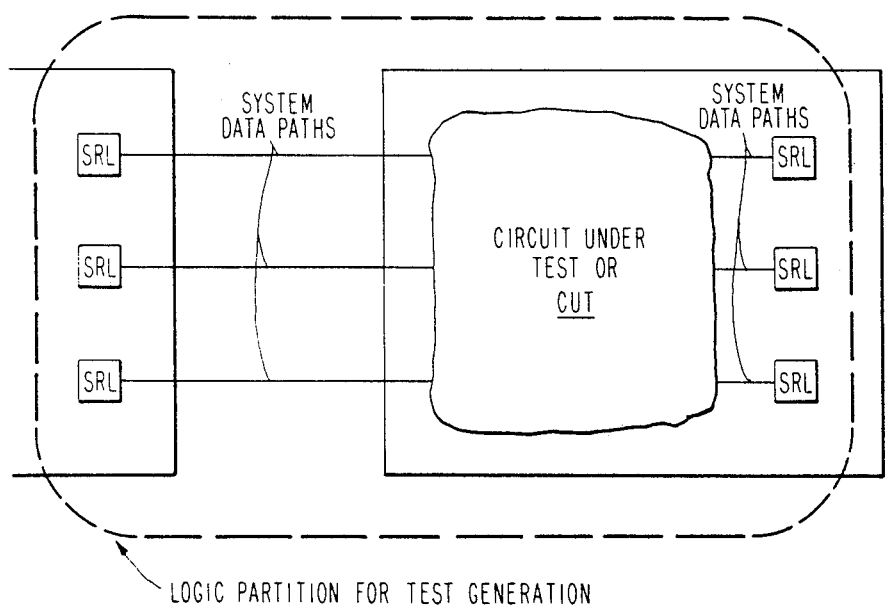
FIG. 22  CUT ENVIRONMENT FOR HALF CPA CUT ENVIRONMENT IN HALF CPA, WHERE NON-CLOCK INPUT IS CONNECTED
TO A PACKAGE NOT CONTROLLED BY MORE THAN ONE SRL

CUT ENVIRONMENT FOR FULL CPA

CUT ENVIRONMENT FOR HALF CPA TEST APPLICATION—
MIGRATION TEST

CUT ENVIRONMENT FOR FULL CPA TEST APPLICATION—
MIGRATION TEST

CHIP PARTITIONING AID (CPA)-A STRUCTURE FOR TEST PATTERN GENERATION FOR LARGE LOGIC NETWORKS

BACKGROUND OF THE INVENTION

Field of the Invention

The invention relates to the testing of integrated circuit chips, multi-chip modules, card, boards, etc., more generally, the invention relates to and has particular utility in the testing of electronic packaging structures having high circuit density and a very large number of inaccessible circuit nodes.

CROSS-REFERENCE TO RELATED APPLICATIONS

1. U.S. patent application Ser. No. 66,130 entitled "Improved Level Sensitive Scan Design System", filed Aug. 13, 1979 by S. DasGupta et al., and of common assignee with the subject application, granted as U.S. Pat. No. 4,293,919 on Oct. 6, 1981.

2. U.S. patent application Ser. No. 62,932 entitled "Method and Arrangement of Testing Sequential Circuits Represented by Monolithically Integrated Semiconductor Circuits" filed July 26, 1979 by J. Hajdu and G. Knauft and of common assignee with the subject application, granted as U.S. Pat. No. 4,298,980 on Nov. 3, 1981.

3. U.S. Pat. No. 4,241,307 entitled "Module Interconnection Testing Scheme" filed Aug. 18, 1978 by Se June Hong, and of common assignee with the subject application granted Dec. 23, 1980.

4. U.S. patent application Ser. No. 974,641 entitled "Testing Scheme For Logic Chips" filed Dec. 29, 1978 by F. F. Tsui and of common assignee with the subject application, granted as U.S. Pat. No. 4,244,048 on Jan. 6, 1981.

5. U.S. patent application Ser. No. 929,480 entitled "Test Circuitry For Module Interconnection Network" filed July 31, 1978, by M. T. McMahon, Jr., and of common assignee, granted as U.S. Pat. No. 4,220,917 on Sept. 2, 1980.

6. U.S. patent application Ser. No. 104,481, entitled "Module Testing On Testers With Insufficient Channels" filed Dec. 17, 1979 by H. D. Schnurmann and of common assignee, granted as U.S. Pat. No. 4,348,759 on Sept. 7, 1982.

7. U.S. patent application Ser. No. 280,050 entitled "Electronic Chip-in-Place Testing (ECIPT) Structure and Method", filed July 2, 1981, by P. Goel and M. T. McMahon. [The disclosures of (1) U.S. Pat. No. 3,761,695 entitled "Method of Level Sensitive Testing A Functional Logic System" granted Sept. 25, 1973 to E. B. Eichelberger, (2) U.S. Pat. No. 3,783,254 entitled "Level Sensitive Logic System" granted Jan. 1, 1974 to E. B. Eichelberger, (3) U.S. Pat. No. 3,784,907 entitled "Method of Propagation Delay Testing A Functional Logic System" granted Jan. 8, 1974 to E. B. Eichelberger, and (4) the publication "A Logic Design Structure For LSI Testability" by E. B. Eichelberger and T. W. Williams, 14th Design Automation Conference Proceedings, pages 462-8, June 20, 21, and 22, 1977, New Orleans, La., IEEE Catalog Number 77, CH 1216-1C are respectively incorporated herein to the same full and complete extent as though the text and drawings of said patents and publication were expressly fully set forth herein].

BACKGROUND AND DESCRIPTION OF PRIOR ART

Several patents and publications identified in the "Background Art" section hereof further disclose Level Sensitive Scan Design (LSSD) methods and discipline that address the afore-recited needs. With the exception of a limited number of patents directed to packaging all the patents come under the generic title LSSD or are closely related thereto.

A common thrust of the LSSD discipline is to prescribe a built-in capability for every LSI unit, such as chip module etc., whereby the entire logic state of the unit, under test, can be explicitly set and/or examined through exercising certain input/output (I/O) procedures at a limited number of I/O terminals. This requirement is implementable by imparting a shift register capability to every one of the logic system latches in the unit and thereupon organizing these shift register latches (SRL's) into one or more shift register data channels with their terminal stages accessible to the outside world. Further information and details of operation using the SRL facility of LSSD are given in a number of prior art patents and publications fully identified in the "Background Art" section set forth hereinafter. [Reference may be made to the following U.S. Pat. Nos.: 3,784,254 entitled "Level Sensitive Logic System" granted Jan. 1, 1974 to E. B. Eichelberger; 3,761,695 entitled "Method of Level Sensitive Testing A Functional Logic System" granted Sept. 25, 1973 to E. B. Eichelberger; and 3,784,907 entitled "Method of Propagation Delay Testing A Functional Logic System" granted Jan. 8, 1974 to E. B. Eichelberger]. Stated very briefly, the LSSD approach comprises a test operation wherein certain desired logic test patterns are serially inputted and shifted to the appropriate latch locations when the unit operated in the "shift mode" (i.e., by withholding the system clock excitations and turning on the shifting clock to the unit). When this is done, the latch states will provide the desired stimuli for the testing of the related logic nets. Now, propagate the test patterns through the nets by executing one or more steps of the "Function Mode" operation (i.e., by exercising one or more system clock excitations). The response pattern of the logic networks to the applied stimuli is now captured by the system latches, in a known manner depending on certain details of hardware design, often replacing the original inputted test patterns. Then, the system reverts to the shift-mode operation, outputting the response patterns for examination and comparison with standard patterns which should be present if the circuitry has operated properly.

In accordance with the prior art teaching, the testing of each chip contained in a high circuit density packaging structure (without disconnecting the chip to be tested from the high circuit density packaging structure, i.e., interconnecting circuitry and other chips) required an array of precisely positioned exposed contact pads for each chip contained and interconnected in the high circuit density packaging structure. The array of precisely positioned exposed contact pads for each chip was utilized by a mechanical test probe head in the testing of the chip subsequent to interconnection of the chip in the high circuit density packaging structure. The array of precisely positioned exposed contact pads (also termed "Engineering Change Pads") for each chip and interconnected in the packaging structure, as known in the art, are also available for engineering change purposes.

This method of testing has the disadvantage of requiring the alignment and subsequent stepping of the probe over the surface of the package—a time consuming process. Since the probe head contacts one chip site at a time, the connections between the chips on the package are not tested.

U.S. Pat. No. 4,220,917 discloses a plurality of interconnected integrated circuit chips each having an array of engineering pads for contact by a test probe and also for engineering change purposes. (U.S. Pat. No. 4,220,917 entitled "Test Circuitry For Module Interconnection Network" granted Sept. 2, 1980 to M. T. McMahon, Jr., and of common assignee herewith).

In accordance with the prior art teaching, an alternate approach to testing circuitry on a high density packaging structure requires through the package-pins test. The LSSD technique is employed to design the component chips of the package as well as to design the inter-chip connections on the package. Automatic test generation for dense LSSD logic structures employs the partitioning technique described in "Test Generation For Large Logic Networks" by P. S. Bottoroff, R. E. France, N. H. Garges and E. J. Orosz, 14th Design Automation Conference Proceedings, June 20, 21 and 22, 1977, New Orleans, La., IEEE Catalog Number 77, CH 1216-1C, pages 479 to 485. The technique logically partitions the dense LSSD logic into portions which are bounded on the inputs and outputs by SRL's and package pins. Tests are then generated individually for each partition and subsequently applied through the pins of the package at the tester. The limitations of the partitioning technique are (a) the partition size can exceed the capacity of available LSSD test generators, (b) the turnaround time to generate package tests is excessive, and (c) the turnaround time to re-generate package tests due to an engineering change is also excessive.

Electronic-Chip-in-Place Testing, however, provides for a design approach and testing method which circumvents the afore-recited problems and will allow testing of each individual chip of a plurality of interconnected chips without physically disconnecting the chip under test and without the need for and utilization of test equipment having a precision probe head and a high precision step-and-repeat mechanism. This method depends on some extra features that are enforced on memory elements that are present in the network to achieve its goal.

The present invention provides for a design approach and testing method which also circumvents the afore-recited problems and will allow testing of each individual chip of a plurality of interconnected chips without physically disconnecting the chip under test and without the need for and utilization of test equipment having a precision probe head and a high precision step and repeat mechanism. This method differs from ECIPT in the following ways: (1) the method does not affect the system latches to achieve its goal; (2) the method does not require that the internal logic conform to the Level Sensitive Scan Design Rules, but rather only that the logic be synchronous in design; (3) the structures defined for this method may be used by the logic designed in the system as normal registers thus incurring little, if any, overhead for test, and/or the structure may be divorced from the system logic design and optimized for testing thus having little impact to the size and wireability of the chips; (4) in one version the method can be used to simultaneously test all chips in unison; lastly (5) the method retains most benefits for those chips where the design approach was followed in an environment where some of the individual chips were not designed according to this design approach.

As with ECIPT, the method permits the reapplication of wafer test data at higher levels of package. In addition, the defined structure herein is compatible to the logical subdividing algorithms described in the 14th Design Automation Conference Proceedings, June 20–22, P. Bottoroff et al., pages 479-485. In one version, latches are placed at both inputs and outputs so as to isolate the internal network of the chip so that, (1) the chip interconnections can be tested independent of the chip internals, thus making that task of the test procedure much simpler; (2) chips with this version may be tested in unison to minimize test application time. Both versions of the method may be combined on a single chip in order to facilitate the testing and diagnosis of a very dense chip.

As will be fully apparent from the hereinafter set-forth detailed description of our invention, the practice of our invention is not limited to any particular physical packaging structure. Merely by way of example, the high circuit density packaging structure containing a plurality of interconnected semiconductor chips may be generally of the type disclosed in one or more of the following patents: U.S. Pat. No. 4,245,273 entitled "Package For Mounting and Interconnecting A Plurality of Large Scale Integrated Semiconductor Devices" granted Jan. 13, 1981 to I. Feinberg and of common assignee herewith; U.S. Pat. No. 3,564,114 entitled "Universal Multilayer Printed Circuit Board" granted Feb. 16, 1971 to M. Blender et al; U.S. Pat. No. 4,263,965 entitled "Leaved Thermal Cooling Module" granted April 28, 1981 to M. S. Mansuria et al. and of common assignee herewith, Ser. No. 133,898, filed Jan. 21, 1980; U.S. Pat. No. 4,138,692 entitled "Gas Encapsulated Cooling Module" granted Feb. 6, 1979 to Robert G. Meeker et al., and of common assignee herewith; U.S. Pat. No. 4,233,645 entitled "Semiconductor Package with Improved Conduction Cooling Structure" granted Nov. 11, 1980 to D. Balderes et al., and of common assignee herewith; U.S. Pat. No. 3,993,123 entitled "Gas Encapsulated Cooling Module" granted Nov. 23, 1976 to R. C. Chu et al., and of common assignee herewith; U.S. Pat. No. 3,726,002 entitled "Process For Forming A Multilayer Glass-Metal Module Adaptable For Integral Mounting to Dissimilar Refractory Substrate: granted April 10, 1973 to B. Greenstein et al., and of common assignee herewith; U.S. Pat. No. 3,838,204 entitled "Multilayer Circuits" granted Sept. 24, 1974 to J. Ahn et al., and of common assignee herewith; U.S. Pat. No. 3,999,004 entitled "Multilayer Ceramic Substrate" granted Dec. 21, 1976 to 0. J. Chirino et al., and of common assignee herewith; U.S. Pat. No. 3,851,221 entitled "Integrated Circuit Package" granted Nov. 26, 1974 to P. E. Beaulieu and of common assignee herewith; and U.S. patent application Ser. No. 8,375 entitled "Improved Heat Transfer Structure For Integrated Circuit Package" filed Feb. 1, 1979 by E. Berndlmaier et al., and of common assignee herewith, granted as U.S. Pat. No. 4,323,914 on April 6, 1982.

Background Art

The following patents and publications are directed to the testing of electronic structures. A number of these patents and publications further disclose LSSD testing arrangements and organizations. It is to be appreciated, with reference to the subject invention, that the following art is not submitted to be the only prior art, the best prior art, or the most pertinent prior art.

Patents:

U.S. Pat. No. 4,071,902 entitled "Reduced Overhead for Gated B Clock Testing" granted Jan. 31, 1978 to E. B. Eichelberger and T. W. Williams and of common assignee.

U.S. Pat. No. 4,051,353 (Ser. No. 701,055) entitled "Implementation of Level Sensitive Logic System Employing Accordion Shift Register Means" granted Sept. 27, 1977 to Hua-Tung Lee and of common assignee herewith.

U.S. Pat. No. 3,961,252 (Ser. No. 534,606) entitled "Testing Embedded Arrays" granted June 1, 1976 to E. B. Eichelberger and of common assignee herewith.

U.S. Pat. No. 3,961,254 (Ser. No. 534,608) entitled "Testing Embedded Arrays" granted June 1, 1976 to J. R. Cavaliere et al. and of common assignee herewith.

U.S. Pat. No. 3,961,251 (Ser. No. 534,605) entitled "Testing Embedded Arrays" granted June 1, 1976 to W. P. Hurley et al., and of common assignee herewith.

U.S. Pat. No. 4,063,080 entitled "Method of Propagation Delay Testing A Level Sensitive Embedded Array Logic System", filed June 30, 1976, granted Dec. 13, 1977 to E. B. Eichelberger, E. I. Muehldorf, R. G. Walther and T. W. Williams and of common assignee.

U.S. Pat. No. 4,051,352 entitled "Level Sensitive Embedded Array Logic System", filed June 30, 1976, granted Sept. 27, 1977 to E. B. Eichelberger, E. I. Muehldorf, R. G. Walther and T. W. Williams and of common assignee.

U.S. Pat. No. 3,789,205 entitled "Method of Testing MOSFET Planar Boards" granted Jan. 29, 1974 to R. L. James and of common assignee.

U.S. Pat. No. 4,006,492 entitled "High Density Semiconductor Chip Organization" filed June 23, 1975, granted Feb. 1, 1977 to E. B. Eichelberger and G. J. Robbins and of common assignee.

U.S. Pat. No. 4,063,078 entitled "Clock Generation Network" filed June 30, 1976 granted Dec. 13, 1977 to E. B. Eichelberger and S. Das Gupta and of common assignee.

U.S. Pat. No. 3,783,254 entitled "Level Sensitive Logic System" filed Oct. 16, 1972, granted Jan. 1, 1974 to E. B. Eichelberger and of common assignee.

U.S. Pat. No. 3,761,695 entitled "Method of Level Sensitive Testing A Functional Logic System" filed Oct. 16, 1972, granted Sept. 25, 1973 to E. B. Eichelberger and of common assignee.

U.S. Pat. No. 3,784,907 entitled "Method of Propagation Delay Testing A Functional Logic System" filed Oct. 16, 1972 granted Jan. 8, 1974 to E. B. Eichelberger and of common assignee.

U.S. Pat. No. 3,746,973 entitled "Testing of Metallization Network on Insulative Substrates Supporting Semiconductor Chips" granted July 17, 1973 to M. T. McMahon, Jr., and of common assignee.

U.S. Pat. No. 3,781,683 entitled "Test Circuit Configuration For Integrated Semiconductor Circuits and a Test System Containing Said Configuration" granted Dec. 25, 1973 to L. E. Freed and of common assignee.

U.S. Pat. No. 3,803,483 entitled "Semiconductor Structure For Testing of Metallization Networks on Insulative Substrates Supporting Semiconductor Chips" granted April 9, 1974 to M. T. McMahon, Jr. and of common assignee.

U.S. Pat. No. 3,815,025 entitled "Large-Scale Integrated Circuit Testing Structure" granted June 4, 1974 to P. V. Jordan and of common assignee.

U.S. Pat. No. 4,055,754 entitled "Memory Device and Method of Testing the Same" granted Oct. 25, 1977 to G. D. Chesley.

U.S. Pat. No. 4,225,957 entitled "Testing Macros Embedded in LSI Chips" granted Sept. 30, 1980 to C. R. Doty, Jr., et al. and of common assign- ee.

U.S. Pat. No. 4,140,967 entitled "Merged Array PLA Device, Circuit, Fabrication Method and Testing Technique" granted Feb. 20, 1979 to P. S. Balasubramanian et al., and of common assignee.

U.S. Pat. No. 4,220,917 entitled "Test Circuitry For Module Interconnection Network" granted Sept. 2, 1980 to M. T. McMahon, Jr., and of common assignee.

U.S. Pat. No. 4,074,851 entitled "Method of Level Sensitive Testing A Functional Logic System with Embedded Array" granted Feb. 21, 1978 to E. B. Eichelberger and of common assignee.

U.S. Pat. No. 3,806,891 entitled "Logic Circuit For SCAN-IN/SCAN-OUT" granted April 23, 1974 to E. B. Eichelberger et al., and of common assignee.

U.S. Pat. No. 4,244,048 entitled "Chip and Wafer Configuration and Testing Method for Large-Scale-Integrated Circuits" granted Jan. 6, 1981 to F. F. Tsui and of common assignee.

U.S. Pat. No. 4,293,919 entitled "Improved Level Sensitive Scan Design System" by S. DasGupta et al., granted Oct. 6, 1981 and of common assignee.

U.S. Pat. No. 4,298,980 entitled "Method and Arrangement of Testing Sequential Circuits Represented by Monolithically Integrated Semiconductor Circuits", granted Nov. 3, 1981 to J. Hajdu and G. Knauft and of common assignee.

U.S. Pat. No. 4,204,633 entitled "Logic Chip Test System With Path Oriented Decision Making Test Pattern Generator" granted May 27, 1980 to P. Goel.

U.S. patent application Ser. No. 280,050 entitled "Electronic Chip-In-Place Testing (ECIPT) Structure and Method", filed July 2, 1981, by P. Goel and M. T. McMahon.

Publications:

"Introduction to An LSI Test System" by M. Correia and F. B. Petrini, 14th Design Automation Conference Proceedings", June 20, 21 and 22, 1977, New Orleans, La., IEEE Catalog Number 77, CH 1216-1C, pages 460-1.

"A Logic Design Structure For LSI Testability" by E. B. Eichelberger and T. W. Williams, 14th Design Automation Conference Proceedings, June 20, 21 and 22, 1977, New Orleans, La., IEEE Catalog Number 77, CH 1216-1C, pages 462-8.

"Automatic Checking of Logic Design Structures For Compliance with Testability Ground Rules" by H. C. Godoy, G. B. Franklin and P. S. Bottoroff, 14th Design Automation Conference Proceedings, June 20, 21 and 22, 1977, New Orleans, La., IEEE Catalog Number 77, CH 1216-1C, pages 469-478.

"Test Generation For Large Logic Networks" by P. S. Bottoroff, R. E. France, N. H. Garges and E. J. Orosz, 14th Design Automation Conference Proceedings, June 20, 21 and 22, 1977, New Orleans, La., IEEE Catalog Number 77, CH 1216-1C, pages 479 to 485.

"Delay Test Generation" by E. P. Hsieh, R. A. Rasmussen, L. J. Vidunas and W. T. Davis, 14th Design Automation Conference Proceedings, June 20, 21 and 22, 1977, New Orleans, La., IEEE Catalog Number 77, CH 1216-1C, pages 486 to 491.

"Delay Test Simulation" by T. M. Storey and J. W. Barry, 14th Design Automation Conference Proceedings, June 20, 21 and 22, 1977, New Orleans, La., IEEE Catalog Number 77, CH 1216-1C, pages 492 to 494.

"Selective Controllability: A Proposal For Testing and Diagnosis" by F. Hsu, P. Solecky and L. Zobniw, 15th Design Automation Conference Proceedings, June 19, 20 and 21, 1978, Las Vegas, Nev., IEEE Catalog Number 78 CH 1363-1C, pages 110-116.

"Testability Considerations in A VLSI Design Automation System" by E. H. Porter (Paper 2.3) 1980 IEEE Test Conference, CH 1608-9/80/0000- 0026 $00.75.

"Automatic Test Generation Methods For Large Scale Integrated Logic" by E. R. Jones and C. H. Mays, IEEE Journal of Solid-State Circuits, Vol. SC-2, No. 4, Dec. 1967, pages 221-226.

"Techniques For The Diagnosis of Switching Circuit Failures", Proceedings of the 2nd Annual Symposium on Switching Theory and Logical Design, October 1960, pages 152-160.

"Semiconductor Wafer Testing" by D. E. Shultis, IBM technical Disclosure Bulletin, Vol. 13, No. 7, December 1970, page 1793.

"Designing LSI Logic For Testability" by E. I. Muehldorf, Digest of Papers 1976, Semiconductor Test Symposium, Memory & LSI, (Oct. 19-21, 1976 held at Cherry Hill, N.J.) sponsored by IEEE Computer Society and the Philadelphia Section of the IEEE, pages 45-49.

"Impact of LSI On Complex Digital Circuit Board Testing" by P. S. Bottoroff and E. I. Muhldorf, Testing Complex Digital Assemblies, Session 32, Electro 77 Professional Program Paper 32/3, pages 1 through 12, New York, April 19-21, 1977, Copyright 1977 Electro.

"Enhancing Testability of Large-Scale Integrated Circuits Via Test Points and Additional Logic" by M. J. Y. Williams et al., IEEE Transactions on Computers Vol. C-22, No. 1, Jan. 1973, pages 46-60.

"Automatic System Level Test Generation and Fault Location For Large Digital Systems" by A. Yamada, et al., 15th Design Automation Conference Proceedings, June 19, 20 and 21, 1978, Las Vegas, Nev., IEEE Catalog Number 78 CH 1363-1C, pages 347-352.

"LSI Chip Design for Testability" by S. Das Gupta et al., 1978 IEEE International Solid-State Circuits Conference, Digest of Technical Papers, February 1978, pages 216 and 217.

"Design For Testability of the IBM System/38" by L. A. Stolte et al., Digest of Papers, 1979, IEEE Test Conference (Oct. 23-25, 1979, Cherry Hill, N.J.) pages 29-36.

"Printed Circuit Card Incorporating Circuit Test Register" by E. I. Muehldorf, IBM Technical Disclosure Bulletin, Vol. 16, No. 6, November 1973, page 1732.

"AC Chip In-Place Test" by M. T. McMahon, Jr., IBM Technical Disclosure Bulletin, Vol. 17, No. 6, November 1974, pages 1907-08.

"Shunting Technique For Testing Electronic Circuitry" by R. D. Harrod, IBM Technical Disclosure Bulletin, Vol. 18, No. 1, June 1975, pages 204-05.

"Interconnection Test Arrangement" by J. D. Barnes, IBM Technical Disclosure Bulletin, Vol. 22, No. 8B, January 1980, pages 3679-80.

"Single Clock Shift Register Latch" by T. W. Wrlliams, IBM Technical Disclosure Bulletin, Vol. 16, No. 6, November 1973, page 1961.

"Trigger Arrays Using Shift Register Latches" by S. Das Gupta, IBM Technical Disclosure Bulletin, Vol. 24, No. 1B, June 1981, pages 615-616.

"Logic-Array Isolation by Testing" by P. Goel, IBM Technical Disclosure Bulletin, Vol. 23, No. 7A, December 1980, pages 2794-2799.

"Functionally Independent A.C. Test For Multi-Chip Packages" by P. Goel and M. T. McMahon, IBM Technical Disclosure Bulletin, Vol. 25, No. 5, October 1982, pages 2308-2310.

"Automated Data Base-Driven Digital Testing" by A. Toth et al., Computer (IEEE Computer Society) Volume 7, Number 1, January 1974, pages 13-19.

"Shift Register Latch For Package Testing in Minimum Area and Power Dissipation" (FI 8-80-0323) by E. F. Culican, J. C. Diepenbrock and Y. M. Ting, IBM Technical Disclosure Bulletin, Vol. 24, No. 11A, April 1982, pages 5598-5600.

"Shift Register Latch Driver" (FI 8-80-0550) by J. C. Diepenbrock, G. J. Gaudenzi and D. C. Reedy, IBM Technical Disclosure Bulletin, Vol. 24, No. 11A, April 1982, pages 5649-5660.

SUMMARY OF THE INVENTION

The invention is a design discipline, or approach, in the form of circuitry and a test method, or methodology, which obviates the problems of the prior art and allows the testing of each individual chip and interchip connections of a plurality of interconnected chips contained on or within a high density packaging structure. This testing is accomplished without the need for and utilization of test equipment having a precision probe and a high precision step and repeat mechanism.

CPA is a method and circuit design discipline that, where followed, will result in a testable multichip package given that each logical component is testable and the design is synchronous in nature. The CPA discipline is able to accomplish this by making use of shift register latches on the chips or functional island periphery. These latches are used to indirectly observe and/or control the synchronous network, in many ways replicating the stuck-fault test environment under which tests were generated at the lower subcomponent level of assembly. One method, full CPA, offers the ability to apply these tests to all full CPA chips on the multi-chip package simultaneously or in unison, thus reducing manufacturing tester time. An additional benefit is the ease of testing intercompetent connections. As stated earlier herein and as will be more fully apparent from the detailed description of our invention set-forth hereinafter, the high density packaging structure containing a plurality of interconnected semiconductor chips may be generally of the type disclosed in IBM NEWS, SPECIAL EDITION, November 1980, Copyright 1980 by International Business Machines. The high density packaging structure is termed a "Thermal Conduction Module".

The "Thermal Conduction Module" has a sizeable number of chip sites available, for example, 100 or 118. The chips are placed on—and are interconnected by—a large, multilayer ceramic substrate whose power and input/output capability is provided through 1800 pins extending from the bottom of the substrate. The chip-populated substrate is placed in a cooling frame where spring loaded pistons that are part of the cooling "hat" subassembly come in contact with each chip. In addition to providing a housing for the pistons, the hat contains helium gas which also helps transmit heat from the chips. Subsequently, the hat is attached to a water (or liquid) cooled assembly.

The "Thermal Conduction Modules" multilayer ceramic substrate is formed from sheets of unfired (green) ceramic, which are "personalized" according to the function each sheet is to perform. First, thousands of minute holes, or vias, are punched in each sheet. The wiring pattern which conducts the electrical signals, is formed by screening a metallic paste onto the sheet through a metal mask. The via holes are also filled with this paste to provide the electrical connections from one layer or sheet to another. The layers are stacked and laminate together under heat and pressure. The laminate is then sintered in a process which shrinks it. This results in a substrate of tile-like hardness with the desired electrical characteristics. Additional metals are plated on the substrate to provide reliable contact surfaces for subsequent chip placement and pin attachments as well as for adding wiring. A finished substrate may have dimensions in the order of 90 millimeters (3.5 inches) square and 5.5 millimeters (2/10 inch) thick.

The technique of joining (connecting) the chips to the substrate may be generally in accordance with the method disclosed in U.S. Pat. No. 3,429,040 entitled "Method of Joining A Component To A Substrate" granted Feb. 25, 1969 to L. F. Miller.

(Reference is also made to the following publications: (1) "A Critique of Chip-Joining Techniques" by L. F. Miller, April 1970/Solid State Technology, Vol. 13/No. 4, pages 50–62; and (2) "A Fabrication Technique For Multilayer Ceramic Modules" by H. P. Kaiser et al., Solid State Technology/May 1972, Vol. 15/No. 5, pages 35–40).

As will be fully apparent from the detailed description hereinafter, the practice of the invention utilizes Level Sensitive Scan Design (LSSD) Rules, or constraints and requires some additional circuit and wiring at the chip level.

A primary object of the invention is an improved electronic testing technique and structure.

A further primary object of the invention is an improved chip test by isolation method and test structure.

A still further primary object of the invention is a testing method and test circuitry which permits the testing of each individual chip of a plurality of interconnected chips contained in a high density packaging structure without requiring excessively long test times. The test method and structure in accordance with the invention does not require chip in place testing using top surface probing or expensive test generation with through-the-pins testing.

A primary object of the invention is the reduction of test pattern generation requirements of second level packages and above to that required for chips.

A primary object of the invention is the simplification of the generation of test patterns to test for chip bonding (i.e., connection to substrate) and interchip wiring defects.

Another primary objective of this invention is a partitioning scheme that limits each test generation partition to little more than the contents of a chip thus containing the size of the network that a test generator needs to handle at any given time.

A feature of the invention is the elimination of probing of second level packages for final test, diagnostics and field return analysis.

BRIEF DESCRIPTION OF THE DRAWINGS

The foregoing and other objects, features and advantages of the invention will be apparent from the following more particular description of the invention and the preferred embodiment of the invention as illustrated in the accompanying drawings.

FIG. 7 schematically illustrates a chip containing the Half CPA concept where all non-clock chip or functional island outputs are first latched into the L1 latch of an SRL and driven out of the chip through off-chip drivers. All non-clock outputs are latched by connecting that line to the system data input of the L1 latch shown in FIG. 1. Either the L1 or L2 output may then feed off chip (see FIG. 7A). Each clock output is fed into the clock input of an SRL in parallel to an off-chip driver. That is to say the clock is connected to the appropriate clock input of an SRL. For example, an A clock being fed off chip would also be connected to the "A Clock" input of an SRL, in parallel, before driving off the chip or functional island. FIG. 7B shows an example of a system clock feeding off-chip as well as the system clock input of an SRL. System clocks which drive CPA latches may either be used in the system operation or may be non-controlling during system operation if used only for testing.

FIG. 7A schematically illustrates in greater detail a first portion of the circuitry shown in FIG. 7. The portion is encircled in FIG. 7 by an enclosed broken line bearing the legend "See FIG. 7A for further detail".

FIG. 7B schematically illustrates in greater detail a second portion of the circuitry shown in FIG. 7. The portion is encircled in FIG. 7 by an enclosed broken line bearing the legend "See FIG. 7B for further detail".

FIG. 8 schematically illustrates a chip containing the full-CPA concept where all non-clock inputs are first latched into an L2* latch of an SRL and then fed to the system logic on chip while all clock inputs feed clock inputs of L1 or L2* latches in parallel to chip logic.

FIG. 8A schematically illustrates in greater detail a first portion of the circuitry shown in FIG. 8. The portion is encircled in FIG. 8 by an enclosed broken line bearing the legend "See FIG. 8A for further detail".

FIG. 8B schematically illustrates in greater detail, a second portion of the circuitry shown in FIG. 8. The portion is encircled in FIG. 8 by an enclosed broken line bearing the legend "See FIG. 8B for further detail".

FIG. 16 shows an n input AND circuit and also depicts the n+1 tests required to test same.

FIG. 17 shows an n input OR circuit and also depicts the n+1 tests required to test same.

FIG. 18 depicts the N+1 tests obtained by combining the corresponding tests for the following examples, trivial dot (n=1), a dot with n=2, a dot with n=3, and where the dot results in an AND gate.

FIG. 21 illustrates a package wiring test of a package net that starts at more than one chip output pin (or package input pin) and wherein it is possible to diagnose distinguishable single stuck faults to the portion of the net that is unique to an individual chip output pin (or package input pin) since the effect of each portion can be observed independently in different tests as in FIG. 21.

FIG. 22 shows the definition of a CUT (Chip Under Test) in a Half CPA environment.

FIG. 27 generally depicts a packaging structure generally of the type briefly disclosed hereinabove and referred to as a Thermal Conduction Module (TCM).

FIG. 28 depicts a substrate (or Multilayer Ceramic, MLC) having one hundred chips connected to contacts on one surface thereof and a sizeable number of package pins (for example 1800) on the opposite surface thereof. The substrate or MLC contains internal wiring (not shown) for interconnecting the chips and package pins.

DISCLOSURE OF THE INVENTION

Figure 1:
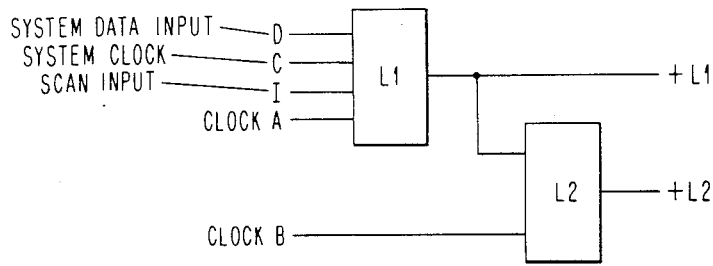
FIG. 1 is a block diagram representation of a shift register latch. The latch includes a first polarity-hold latch L1 and a second polarity-hold latch L2.

Chip Partitioning Aid (CPA) is a structure and methodology which extends the usage of Level Sensitive Scan Design (LSSD) hardware and provides the following benefits:

(A) The problem of test generation for a large logic assembly, be it a Field Replaceable Unit (FRU) or a complete computer system, is reduced to one of generating tests for the individual logic chips that constitute the logic assembly. Test generation for the individual logic chips is done assuming complete controllability and observability of the chip inputs and the chip outputs respectively. At higher levels of packaging, Half CPA forces a partition around chip boundaries so that irrespective of the size of the total network, test generation partitions are limited to essentially single chips. Chip level tests can, however, be re-applied at higher package levels if two or more chip inputs are not connected together at the higher package levels. This constraint saves the test-regeneration effort for chips at higher package levels.

Full CPA, on the other hand, isolates the internal circuits of the chip at higher packaging levels. Therefore, chip level tests can be migrated for use in testing the chip at higher packaging levels. The only task left after that is to test the connections between chips which is now a much simplified task.

(B) All levels of package wiring (i.e. wiring between chips and between package I/O's) are readily testable for both open and stuck-at-failures. The tests are generated by a simple procedure and can be applied solely via external package pins. Furthermore, excellent diagnostic resolution is provided without a need for probing the package.

(C) Given a defective FRU it is feasible to retest each chip using the FRU external pins only. The re-test in most cases provides diagnostic resolution to the failing chip, thus facilitating the FRU repair process.

(D) The same tests applied at the chip level can be applied at the computer systems level, either at the manufacturing site or customer installation, using a maintenance processor. In this manner, inter package connection (card, board, cable, or Thermal Conduction Module, TCM), can be tested without having to generate test patterns at the systems level.

(E) For chips with the Half CPA structure, the number of LSSD rules that need to be practiced across chip boundaries is substantially reduced, thus simplifying designer effort in achieving a testable design. The Half CPA structure obviates the need for practicing the LSSD discipline for the entire package. Instead it is required that the LSSD discipline be followed for each chip and for the package clock distribution network. Further, the LSSD requirement which ensures the capability of scanning data into and out of the package SRL's must be satisfied by the total package design. [The LSSD discipline is extensively disclosed and discussed in the testing art. See, for example: (1) U.S. Pat. No. 3,783,254 entitled "Level Sensitive Logic System" granted Jan. 1, 1974 to E. B. Eichelberger, of common assignee herewith; or (2) "A Logic Design Structure For LSI Testability" by E. B. Eichelberger and T. W. Williams, 14th Design Automation Conference Proceedings, pages 462–8, June 20, 21 and 22, 1977, New Orleans, La., IEEE Catalog Number 77, CH 1216-1C]. For Full CPA the chip internal design must be synchronous and the clocks must be controlled by package primary inputs. Given these constraints, the previously generated chip tests can be re-applied at higher levels of packaging.

(F) Since, with Full or Half CPA, the chip level tests may be re-applied at higher levels of packaging, or if the tests are regenerated, the problem of test regeneration is bounded to essentially one chips worth of logic, the test generation resulting from an Engineering Change (EC) is confined to the EC'ed chips only. This process is substantially faster than current methods of regenerating tests for the entire package. This facilitates engineering bring-up.

(G) The technique can be applied to functional islands on a VLSI chip or package such that the individual functional islands may be subject to test generation as if their inputs and outputs were totally accessible.

CPA DESIGN STRUCTURE

Figure 2:
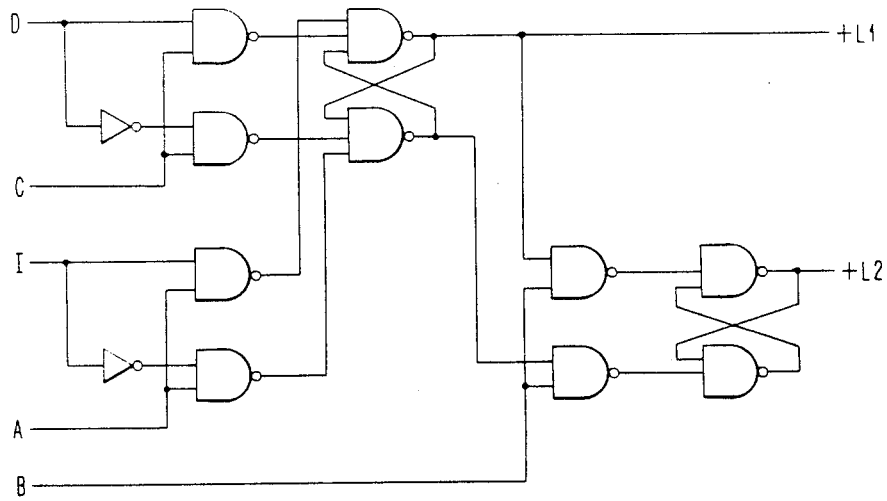
FIG. 2 discloses an implementation of the Shift Register Latch (SRL) of FIG. 1 in AND-INVERT gates.

CPA employs a design structure in which shift register latches (or SRL's) are employed as "extended" tester probes. FIG. 1 shows a schematic of an SRL. Generally an SRL consists of a pair of latches—the L1 latch and the L2 latch. FIG. 2 discloses an implementation of the Shift Register Latch (SRL) of FIG. 1 in AND-INVERT gates. As in FIGS. 3 and 4, any number of SRL's may be tied together to form a shift register.

Figure 3:
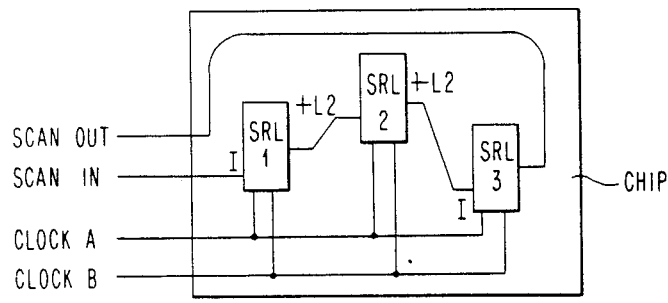
FIG. 3 discloses an integrated circuit chip with three interconnected SRL's.
Figure 4:
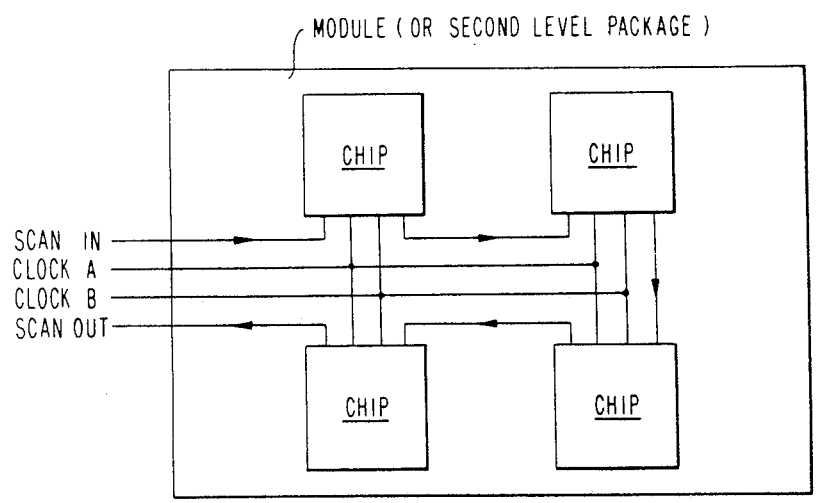
FIG. 4 discloses the interconnection of SRL's contained in an integrated circuit packaging structure, or module, which includes four interconnected integrated circuit chips.

FIG. 3 discloses the interconnection of three SRL's contained on a single chip. FIG. 4 discloses the interconnection of the SRL's contained on four chips contained on a module, or packaging structure. (See for example, U.S. Pat. Nos. 3,761,695, 3,783,254 and 3,784,907). The L1 and L2 latches can have several data ports. Each data port is defined by a data input and a clock input such that when the clock input is pulsed, the logic state on the data input is stored in the latch. For correct operation it is assumed that at any given time, a pulse is applied at the clock input of at most one data port of each latch. The L1 latch shown in FIG. 1 has a "scan" data port with a scan data input (I) and a scan clock (A). The L2 latch of FIG. 1 also has a "scan" data port with its scan data input connected to the output of the L1 latch and a clock (B). The 3-stage shift register of FIG. 3 is formed by (i) connecting the A clock inputs of all SRL's to a unique external A clock chip pad (A), (ii) connecting the B clock inputs of all SRL's to a unique external B clock chip pad (B), (iii) connecting a unique chip pad called the scan input (IN) to the I input of the first SRL in the shift register, and (iv) connecting the L2 output of the last SRL in the shift register to a unique chip pad called the scan output (OUT). Using the SCAN-IN, Clock A, Clock B and SCAN-OUT chip pads it is possible to preset (load) the shift register to any desired state or to observe (unload) the shift register state.

The structure is extended to further levels of packaging as shown in FIG. 4. Here, 4 chips have their SCAN-IN and SCAN-OUT pads connected in a serial fashion and brought out to unique module SCAN-IN and module SCAN-OUT pins. A clock and B clock chip pads are connected in parallel and brought out to unique module Clock A and module Clock B pins.

Figure 5:
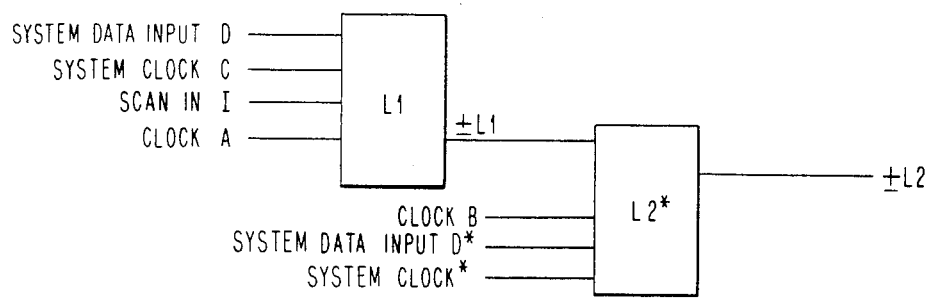
FIG. 5 discloses an SRL containing an L2* latch. Both latches have independent system data inputs clocked by separate system clocks. In the scan path, the L1 latch feeds the L2* latch to form a shift register latch.
Figure 6:
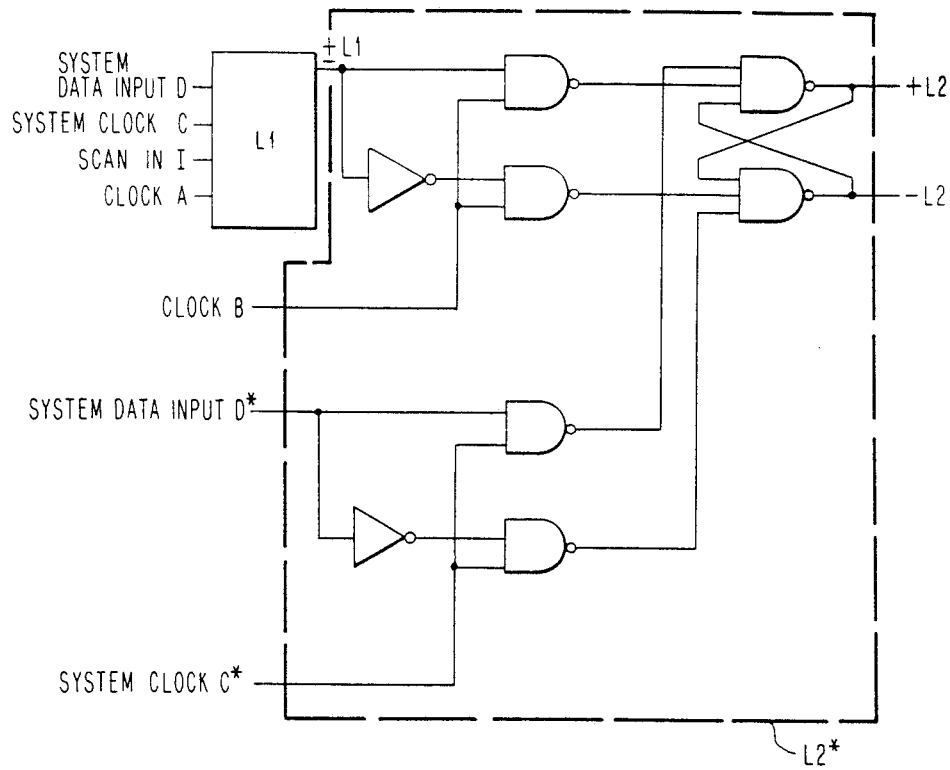
FIG. 6 discloses an implementation of an SRL with the L2* latch using AND-INVERT gates.

The scan data ports of the L1 and L2 latches are generally used for test purposes only, i.e. to load or unload the individual SRL's as desired. The L1 and L2 latches can have additional data ports for system usage of the SRL's (as in an LSSD network). The data port is shown in FIG. 1 with the system data input (D) and System Clock input (C). The L2 latch may incorporate an additional data port as shown in FIG. 5. This type of latch is used in a Full CPA design. In FIG. 5 the SRL depicted has an L1 latch and a L2* latch. It is to be noted that the L2* latch has an additional data port when contrasted with the L2 latch of FIGS. 1 and 2.

The CPA structures provide a means whereby the problem of test generation is bounded to essentially one chip's worth of logic or, tests generated for a chip can be re-applied when the chip is packaged on a module, card, board, TCM, etc. The structure additionally provides the means for simplified test of failures associated with inter-chip wiring on any package level, as well as failures associated with chip inputs and outputs. The notion of a chip on a module is chosen strictly for ease of expression but it will be readily evident to persons skilled in the art that the structure and practice of the invention will apply to any logic connective with well defined boundaries.

Provision #1

System SRL's and CPA SRL's are configured such that:
(a) A unique CPA-SRL is placed between each chip logic output and the corresponding off chip driver (OCD);

(b) each LSSD (C, A, or B, as in FIG. 1) clock output of a chip feeds a clock input of a CPA SRL in parallel to the off-chip driver (OCD).

Figure 8A:
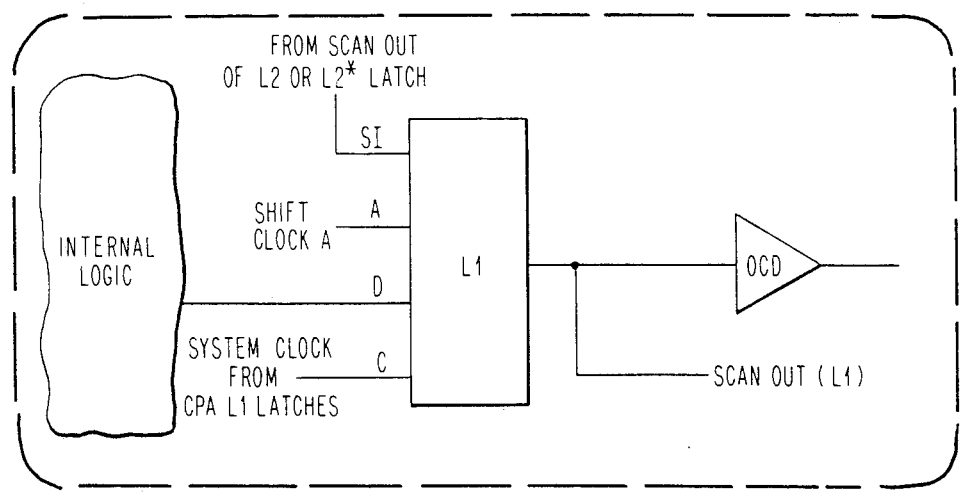
As shown in FIG. 8A, as with half CPA, the non-clock output feeds the system data input of the L1 latch.
Figure 8B:
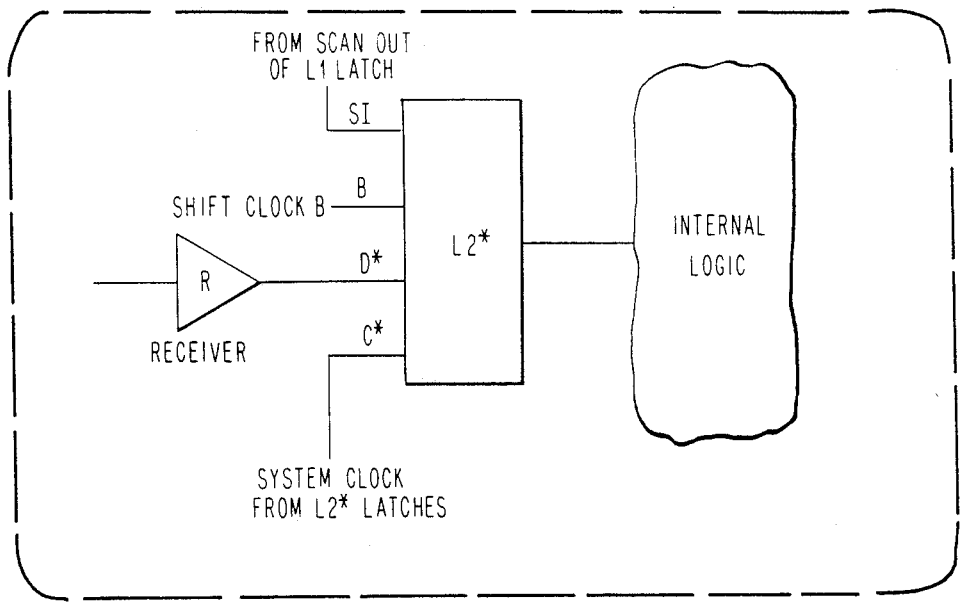
In FIG. 8B, a non-clock input feeds the system data input of an L2* latch. Chip or functional island outputs are treated the same way as in FIG. 7. An L1 latch from a chip output combines with an L2* latch from a chip or functional island input to form an SRL of the type described in FIG. 5. System clocks driving CPA latches may either be used in the system operation or may be used only for testing. In the latter case, the system clock to these latches would be held on in the normal system operation of the chip or functional island. In this manner, the SRL is flushing or passing data directly through the latch.

In addition, in full CPA, each non-clock input feeds the L2* latch of a CPA SRL while each clock input to a chip feeds a CPA SRL in parallel to the system SRL's that it drives. FIG. 7 demonstrates a Half CPA environment in a chip while FIG. 8 shows a Full CPA structure in a chip.

Provision #2

Figure 9:
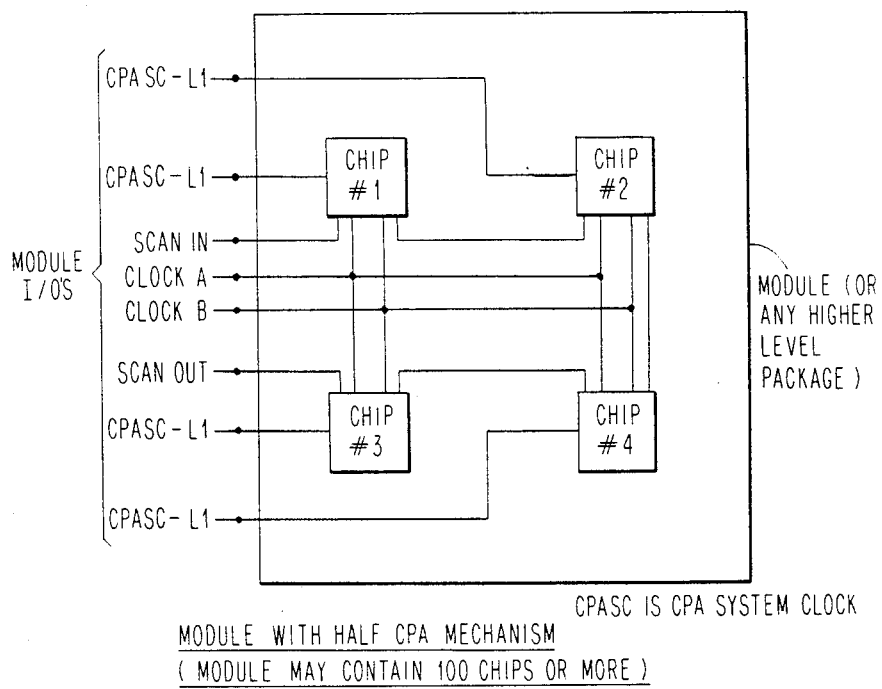
FIG. 9 schematically depicts four chips using Half-CPA interconnected on a module (TCM, or any second level package) wherein "Scan In", "Scan Out", "Clock A", "Clock B", and "CPA System Clocks" are brought out to module controls.
Figure 10:
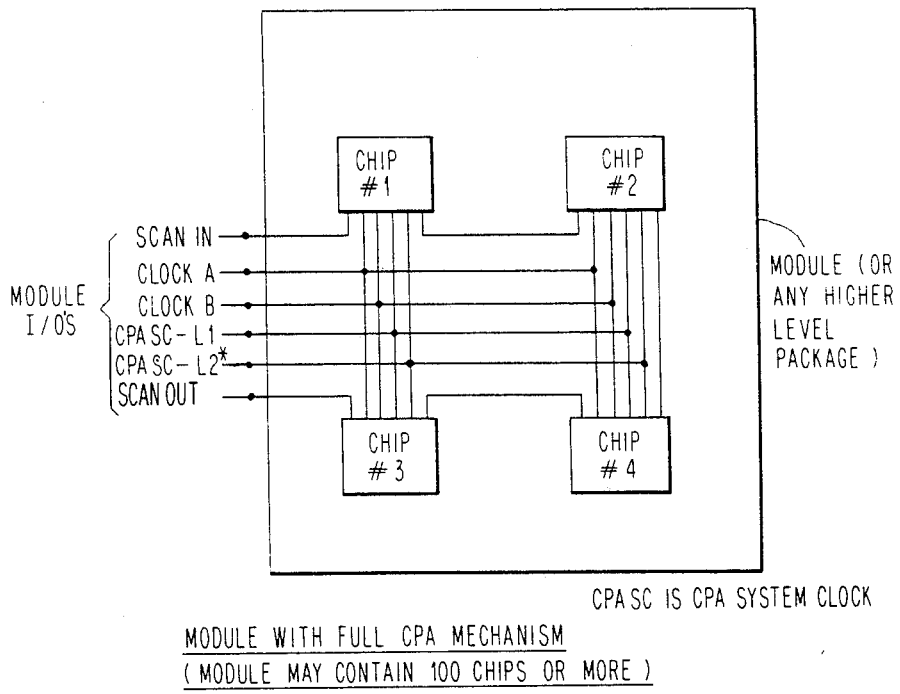
FIG. 10 schematically depicts four chips using Full-CPA interconnected on a module (TCM or any second level package) wherein "Scan in", "Scan-out", "Clock A", "Clock B" and "CPA System Clocks" are brought out to module controls.
Figure 11:
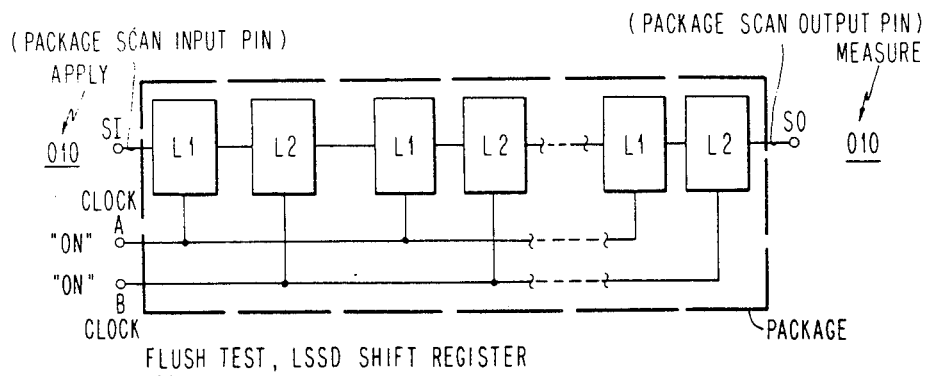
FIG. 11 schematically depicts a package shift register, comprised of SRL's, and having a package scan input, a package scan output, a clock A input and a clock B input. The Shift Register of FIG. 11 is to be viewed in particular, in conjunction with the explanation of a Shift Register "Flush" Test set forth herein.
Figure 12:
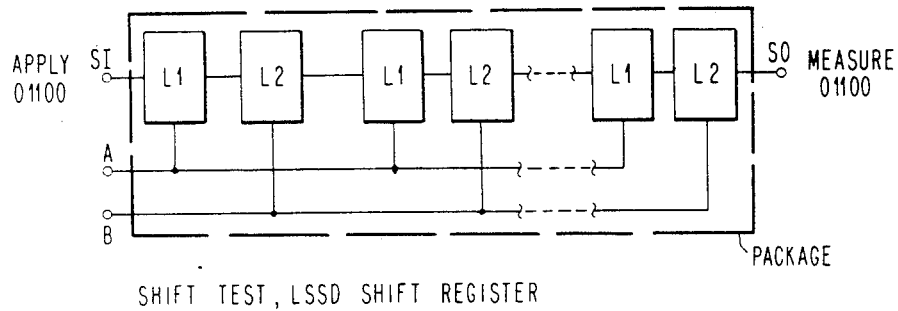
FIG. 12 schematically depicts a package shift register, comprised of SRL's, and having a package scan input, a package scan output, a clock A input and a clock B input. The Shift Register of FIG. 12 is to be viewed, in particular, in conjunction with the explanation of a Shift Register "Shift" Test set forth herein.
Figure 13:
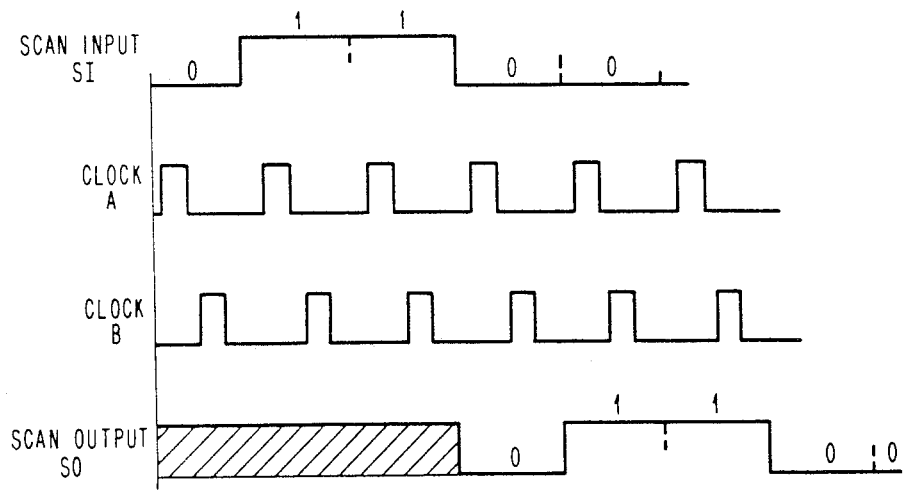
FIG. 13 shows idealized waveforms for a "Shift Test" of the shift register depicted in FIG. 12.

When chips containing the mechanism described in provision 1 are connected on a module (or any higher level package) the following conditions should be established:
(a) all shift register controls and data (SCAN-IN, SCAN-OUT, CLOCK A, CLOCK B) should be connected to module I/O's,
(b) all system clocks should be controllable from module I/O's,
(c) in Half CPA, in a worst case picture, each chip CPA clock, CPASC-L1, has to be brought out to a separate package pin. CPA clocks for different chips can be fed from a common pin, however, only if these chips do not feed each other. In full CPA, on the other hand, each chip requires two CPA clocks, CPASC-L1 and CPASC-L2*. Each clock requires a separate package pin. However, unlike half CPA, a common pin for CPASC-L1 can drive all corresponding inputs for all chips. The same is true for the package pin reserved for CPASC-L2*. FIG. 9 shows a module implemented Half CPA chips. FIG. 10 shows a module implemented with Full CPA chips.

Note again, that the invention described here is not limited to a chip on a module. Rather, it applies to any logic connective with well defined boundaries.

TESTING IN THE CPA ENVIRONMENT

This section addresses testing in two aspects—testing of the chip and testing of module containing the chips. The latter, of course, has, in turn, two aspects—Half CPA and Full CPA.

CHIP TESTING PROCEDURE

The test generation process for a CPA chip is identical to that employed for a chip with Level Sensitive Scan Design (LSSD) logic and has been widely published. All of the apparatus and program controls necessary for generating the test patterns and performing the tests are known in the art. For example, the programs necessary to develop the test patterns for performing combinational tests on a unit or chip under test are described in a paper entitled "Algorithms for Detection of Faults in Logic Circuits" by W. G. Bouricius et al., which was published in Research Report RC 3117 by the IBM Thomas J. Watson Research Center on Oct. 19, 1970. An algorithm for the computation of tests for failures is described in "Diagnosis of Automata Failures A Calculus and a Method" by J. Paul Roth in the IBM Journal of Research and Development, July 1966. These papers described how to develop programmed algorithms for test generation and test evaluation. These include the generation of the assumed fault data necessary for the automatic test generation system.

It is to be understood that the invention of this application does not reside in the generation of the test patterns for application to a unit, or chip under test but rather is directed to the structure of the unit and method of testing the unit when the patterns are applied to it. To accomplish the testing of a unit or chip, the requirements of LSSD and the invention must be present in the unit.

The actual application of tests for a CPA chip is identical to that employed for LSSD chips and systems and is extensively disclosed in the art. For example, U.S. Pat. Nos. 3,783,254, 3,761,695, 3,784,907 and the earlier identified publications set forth in the 14th Design Automation Conference Proceedings, June 20, 21 and 22, 1977, New Orleans, La., IEEE Catalog Number 77, CH 1216-1C, pages 460-1.

PACKAGE TESTING PROCEDURE

Package testing in the CPA environment is dependent on whether the chips are designed in Half CPA or Full CPA. The following sections describe both approaches to package testing.

PACKAGE TESTING IN THE HALF CPA ENVIRONMENT

Figure 23:
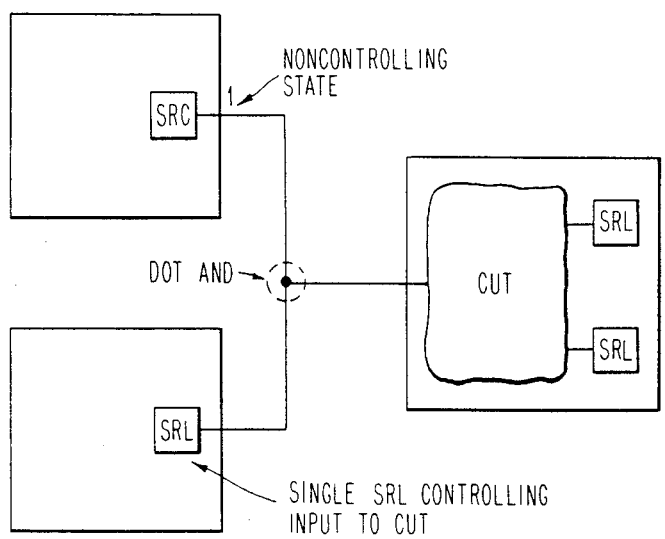
FIG. 23 shows a CUT non-clock input connected to a package net controlled by more than one shift register latch, where all but one of the shift register latches is connected to the non-controlling state.
Figure 24:
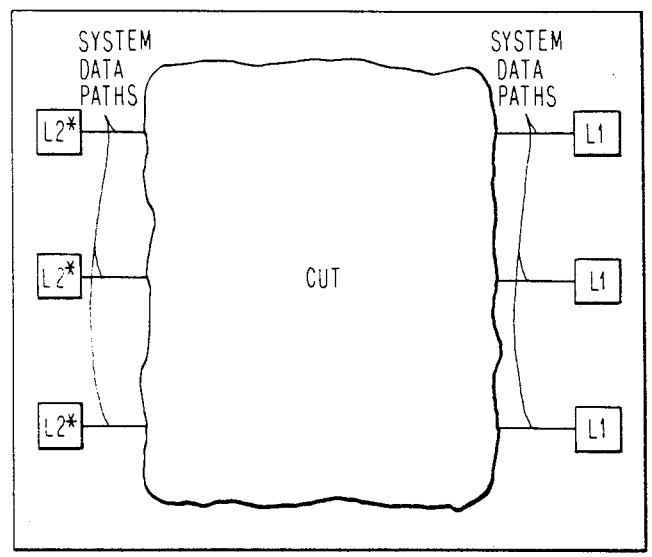
FIG. 24 shows the definition of a CUT in a Full CPA environment.

The tests for a CUT (Chip Under Test) in the Half CPA Environment can be generated in one of two ways—either (a) the CUT with the surrounding shift register latches and those package pins that control the CUT clock inputs be treated as a logic partition (FIGS. 22 and 23) in the sense described in the prior art references, fully identified supra herein. (Specifically, U.S. Pat. Nos. 3,783,254, 3,761,695, 3,784,907 and the earlier identified publications set forth in the 14th Design Automation Conference Proceedings, June 20, 21 and 22, 1977, IEEE Catalog Number 77, CH 1216-1C) or (b) the CUT tests may be generated on a stand-alone basis and be migrated to the surrounding shift register latches and package pins. We shall describe the migration approach since the logic partition approach has been further described in published literature.

Figure 25:
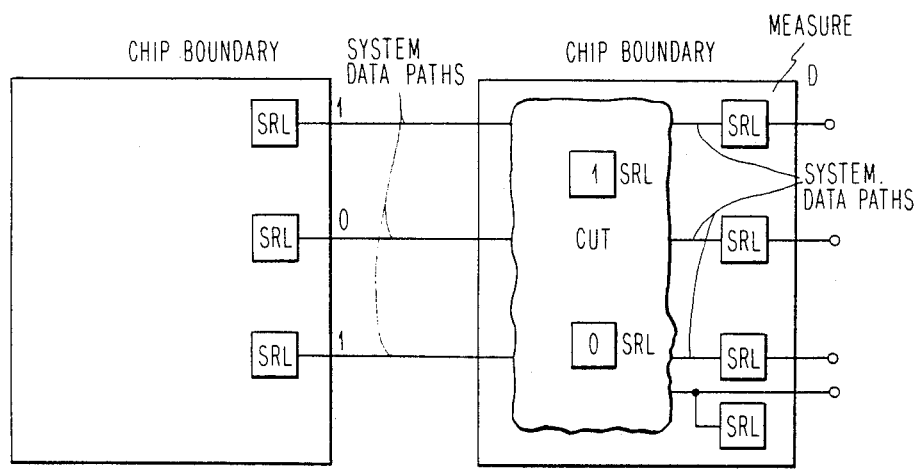
FIG. 25 depicts a CUT in the Half CPA environment for which test patterns can be migrated from the chip level. Test stimuli are applied to CUT through SRL's within the CUT and CPA SRLs feeding drivers on driving chips and test results are measured at SRLs in the CUT or CPA SRLs fed by CUT.

The stand-alone CUT tests can be readily migrated to the package if the tests are constrained in the manner described below:

The test stimuli after applying initial values to the CUT inputs and shift register latches includes pulsing of one or more of system clocks, A or B clocks. The test responses are obtained by a subsequent shift register unload but no measurement of CUT outputs—as in FIG. 25.

Since package testing includes shifting values in many or all package SRL's, CUT patterns for chips that do not directly communicate with one another on the package, may be merged into a given test. This would facilitate testing by reducing the time it takes to apply test patterns.

PACKAGE TESTING IN THE FULL CPA ENVIRONMENT

Package testing in the Full CPA environment is done in two parts: (i) testing of the internal circuitry of the chips, i.e., the logic circuits and (ii) the package test i.e., testing the package wiring, package pins and chip externals (drivers and receivers).

Figure 26:
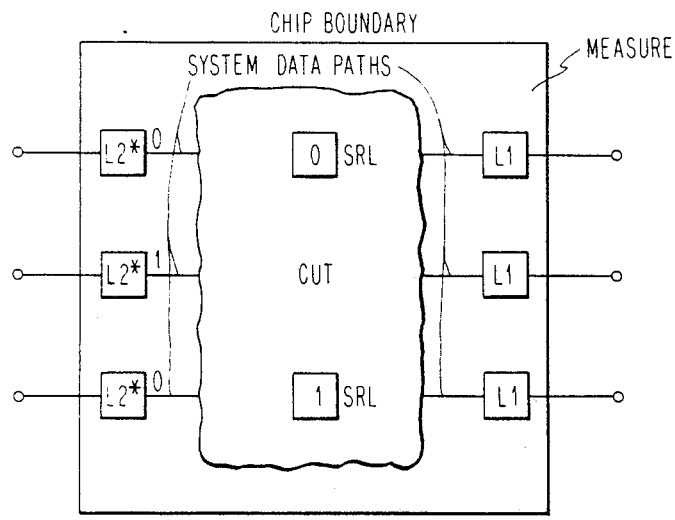
FIG. 26 depicts a CUT in the Full CPA environment for which tests are migrated from the chip level. Test stimuli are applied to CUT through L2*'s at input of chip and SRLs within CUT and test results are measured at CPA L1 latches at chip outputs and SRLs within CUT.
Figure 27:
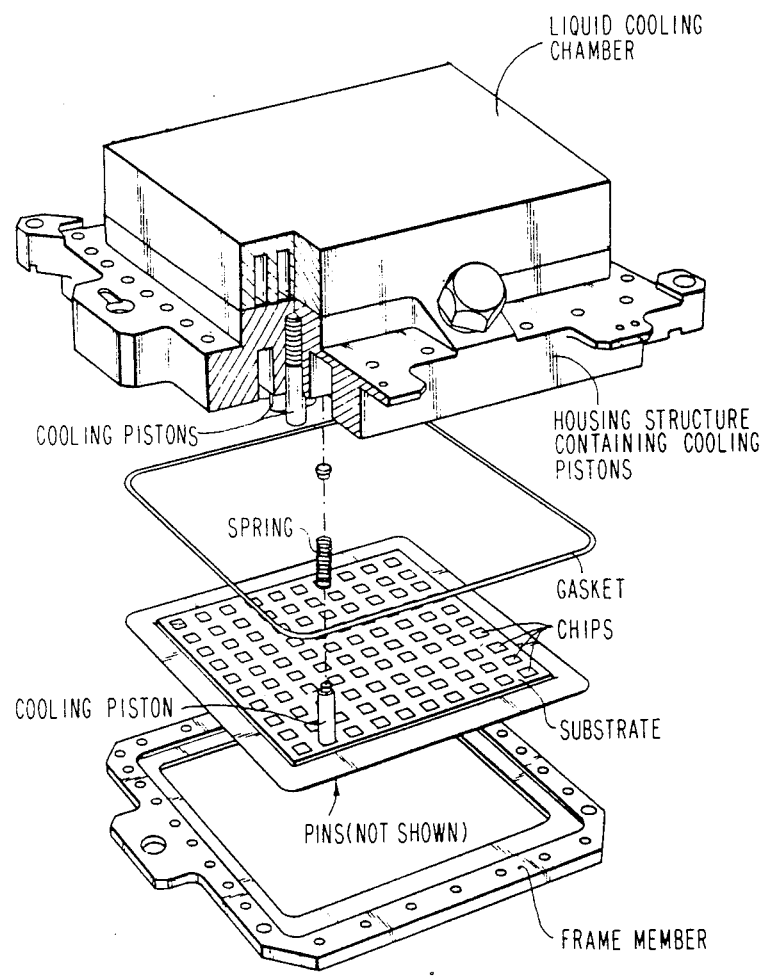
FIGS. 27 and 28 are to be viewed together.
Figure 28:
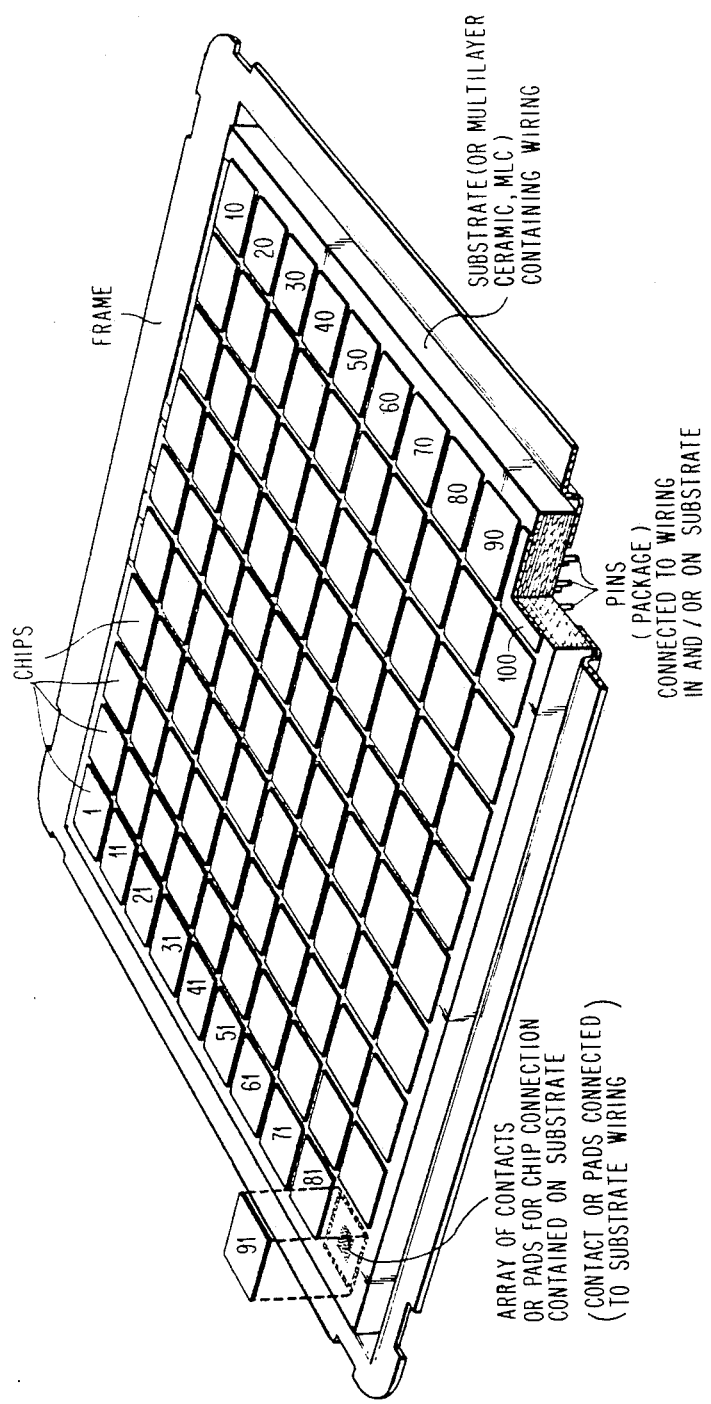

Testing of the internal circuits of the chip is similar to the chip test with the exception that (i) the receivers/drivers are not tested and (ii) whereas in chip testing, tests could be applied through chip inputs, and results observed through chip outputs, at the package level all logic inputs are driven from the L2* latches of CPA SRL's at chip inputs and the results stored into the L1 latches of CPA SRL's that feed the drivers and then shifted out to the tester. FIG. 26 demonstrates what is described above. Since the CPA latches at the inputs and outputs of a chip isolate the internal logic of each chip from the rest of the module, it is possible to test the internal logic of all chips simultaneously by shifting in a test pattern for each chip at the same time. This is one of the key advantages of full CPA and is intended to reduce testing times for dense modules.

Figure 14:
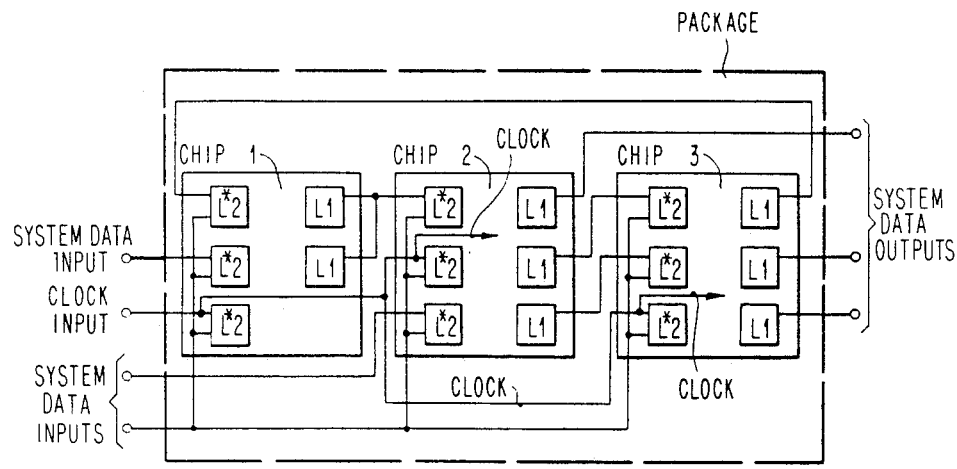
FIG. 14 shows an integrated circuit package including all (three shown) chips in preparation for performing a "Package Wiring Test".
Figure 15:
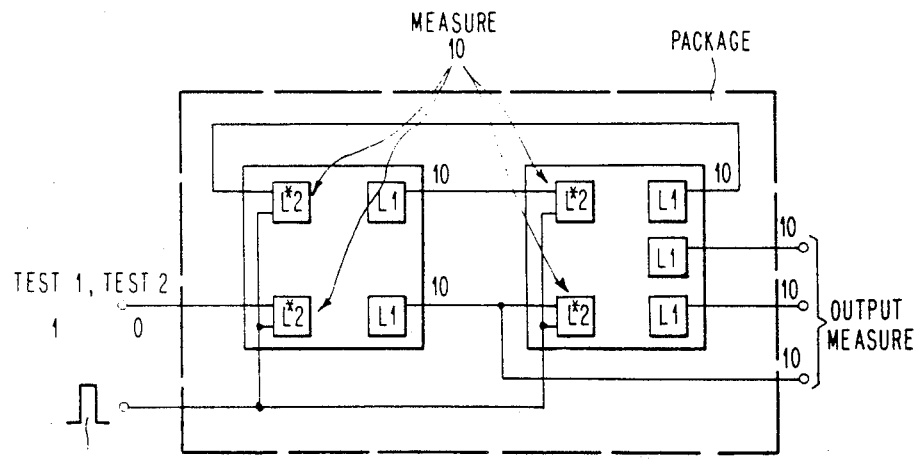
FIG. 15 shows an integrated circuit package including all (two shown) chips in preparation for performing a "Package Wiring Test" (with no dotting of chip outputs).

Package testing in the full CPA environment is a much simplified task. It is limited to (i) testing the connections from all module inputs into chip pads and into the L2* latches of CPA SRL's and (ii) testing the connections from the L1 latches of CPA SRL's through off-chip drivers, through module wiring into either the L2* latches of CPA SRL's on other chips or module outputs. FIGS. 14 and 15 describe the environment that is addressed here.

If no two connections are tied together to form an AND or OR function on the module, i.e., there is no module net with more than one driving source, then the test of all the connections above can be achieved with only two tests. The first test requires all module inputs to be set to a "0" value and all CPA L1 latches to have a "0" value scanned into them prior to a true test. Given this set-up, the expected value at all module outputs and the inputs to all CPA L2* latches should be "0". A value of "1" indicates a fault somewhere in the path to the point where the erroneous value is being observed. For example, if a module output is recording the faulty value, it indicates either a fault in the module pin or wire connecting to the pin or a bad connection from the chip that feeds this module wire or a failure in the driver that drives that chip pad. If a fault appears at the input of a CPA L2* latch, the fault could be in the chip pad, the module wire or whatever feeds the module wire, i.e., either a module pad or another chip. In case of the latter, the fault may be in the pad of the driving chip or its driver. Note that fault conditions appearing at the CPA L2* latches are observed by shifting out the value as in an LSSD network. The test described so far tests for all stuck-at-1 faults in the subnetwork under consideration. The second test requires all module inputs to be set to "1" and all CPA L1 latches to be set, by prior scanning, also to a "1". The expected value at all module outputs and CPA L2* latches would be a "1". Thus, this is a test for stuck-at-0 faults in the sub-network under consideration.

Figure 19:
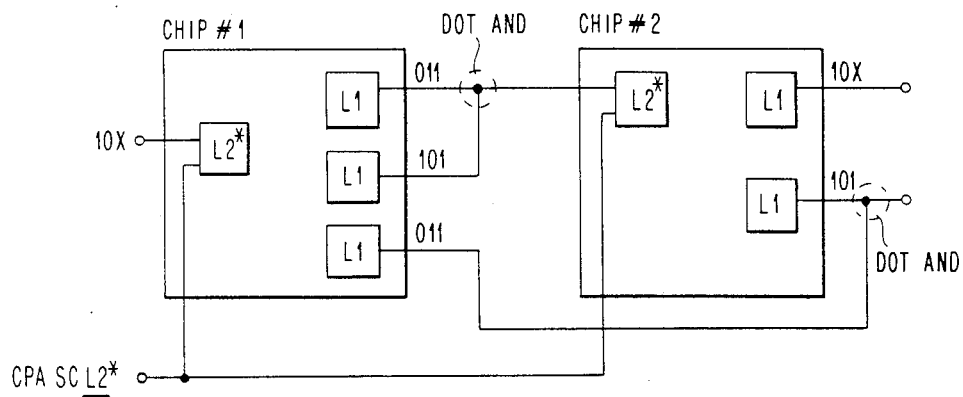
FIG. 19 depicts, relative to a package wiring test, the three tests needed when at most two chip outputs are dotted together anywhere on the package.
Figure 20:
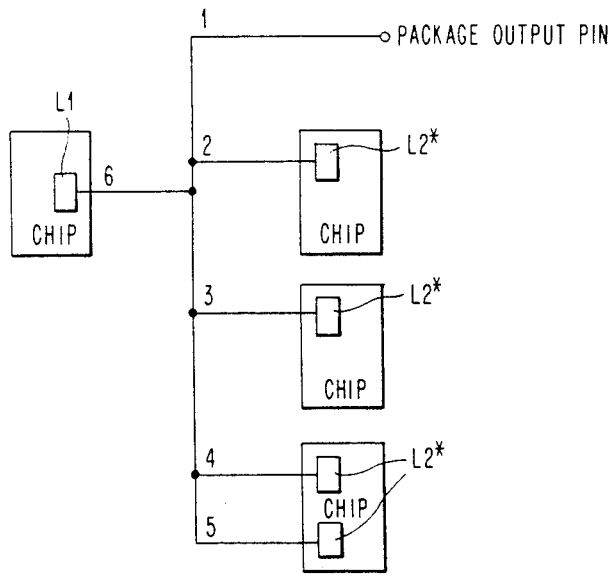
FIG. 20 illustrates a package network that interconnects a chip output pin, first, second, third and fourth chip input pins and a package output pin. In the package wiring test the one through six portions of the package net are independently diagnosable based on observed values at the package output pin and the four L2 latches.

If the module wiring is somewhat more complicated with module nets containing multiple driving sources so that they perform either an AND or OR of the driver outputs, then the package tests is done in as simple an approach as before, except that it requires more tests. FIG. 19 describes the situation under consideration. It shows two outputs of one chip dotted on the module to form an AND and the resultant signal feeds a CPA L2* latch on another chip. Since the dot-AND has two inputs to it, it needs three tests where the two inputs into the dot must have the value 01, 10 and 11 respectively to detect all single stuck-at-faults associated with that AND function. These tests are applied by shifting in the required patterns into the CPA L1 latches on the outputs of the driving chip and the results are observed at CPA L2* latch on the driven chip that is fed by the dot-AND. In general, if the maximum number of drivers which are dotted on the module equals n, then (n+1) tests - (11 ... 1, 01 ... 1, 101 ... 1, ..., 11 ... 10) - would test for all single stuck-at-faults on the module. If the dot acts like an OR, then the (n+1) tests would be 0 ... 0, 10 ... 0, 010 ... 0, ..., 00 ... 01. Note that a dot can exist between one or more module input and a one or more chip outputs. In that case, part of each test pattern is applied from the module inputs and part from the CPA L2* latches driving the chip outputs in question. If, also, this dot feeds a module output, then the results of the tests are directly observable.

While this invention has been particularly described with reference to the preferred embodiments thereof, it will be understood by those skilled in the art that the foregoing and other changes in form and details may be made therein without departing from the spirit and scope of the invention.

We claim:

1. An integrated circuit packaging structure said packaging structure comprising:

a substrate having a first planar surface and a second planar surface oppositely disposed from said first planar surface, said first planar surface containing n arrays of closely spaced contacts, said second planar surface of said substrate containing an array of contacts, said contacts of said array contained on said second planar surface of said substrate being more widely spaced apart, one from another, than said contacts of each of said n arrays of contacts;

first passive circuit means contained at least in part in said substrate for interconnecting said contacts of said n arrays contained on said first planar surface of said substrate and said contacts of said array of contacts contained on said second planar surface of said substrate;

n integrated circuit chips, each of said n integrated circuit chips including receiver circuit means, internal functional circuit means and off chip driver circuit means, each of said n integrated circuit chips having a first planar surface and a second planar surface oppositely disposed from said first planar surface; each of said n integrated circuit chips having an array of contacts on said first planar surface thereof, said array of contacts of each of said n integrated circuit chips respectively corresponding to, and electrically connected to one of said n arrays of contacts contained on said first planar surface of said substrate, each of said n arrays of contacts on said chips providing electrical contact to the integrated circuits on the chip connected thereto;

each of said n integrated circuit chips containing a multi-stage shift register, each stage of said multi-stage shift register comprising a shift register latch (SRL) each shift register latch having a first DC latch (L1) and a second DC latch (L2);

circuit means serially interconnecting said multi-stage shift register contained on each of said chips into a single large multi-stage shift register, said single large multi-stage shift register having input means, output means and control means, said input means, output means and said control means being respectively accessible via a predetermined limited number of said contacts of said array of contacts contained on said second planar surface of said substrate, each multi-stage shift register on each of said n chips having at least a first portion and at least a second portion, said first portion of said multi-stage shift register on each of said n chips being additionally connected at least in part between said receiver circuit means and said internal functional circuit means of said chip and said second portion of said multi-stage shift register on each of said n chips being additionally connected at least in part between said internal functional circuit means and off-chip driver circuit means of said chip; and n additional circuit means, each of said n additional circuit means being connected between the multi-stage shift register on a discrete one of said n integrated circuits and at least a predetermined one of said contacts of said array of contacts on said second planar surface of said substrate.

2. An integrated circuit packaging structure, as recited in claim 1, wherein said input means of said single large multi-stage shift register is a scan input, said output means of said single large multi-stage register is a scan output, and said control means is adapted to receive an A clock and a B clock.

3. An integrated circuit packaging structure, as recited in claim 2, wherein each stage of said single multi-stage shift register includes a first DC latch (L1) and a second DC latch (L2) and at least certain of said second DC latches (L2*) include a CPA data port.

4. An integrated circuit packaging structure, as recited in claim 3, wherein said first DC latch (L1) has a System Data Input (D), a System Clock Input (C), a Scan- Input (I), an A-Clock input, a true Output (+L1) and a Complement Output (−L1) and each said certain second DC latch (L2*) has a true Input connected to said true output (+L1) of said first DC latch (L1), a complement input connected to said complement output (−L1) of said first DC latch (L1), a B-Clock input, a System Data Iput (D*), a System Clock Input (C*) and at least a true output (L2).

5. An integrated circuit packaging structure, as recited in claim 4, wherein each of said shift register latches including an L2* latch having a CPA data port comprises;

first, second, third, fourth, fifth, sixth, seventh and eighth AND INVERT circuits, each of said first through eighth AND INVERT circuits having a first and second input and an output;

ninth, tenth, eleventh and twelfth AND INVERT circuits, each of said ninth through twelfth AND-INVERT circuits having first, second and third inputs and an output;

said first input of said first AND-INVERT circuit being connected to said System Data Input (D);

said second input of said first AND-INVERT circuit and said second input of said second AND-INVERT circuit being connected in common to said System Clock Input (C);

a first INVERTER circuit having an input and an output, said input of said first INVERTER circuit being connected to said System Data Input (D) and said output of said first INVERTER circuit being connected to said first input of said second AND-INVERT circuit;

said first input of said third AND-INVERT circuit being connected to said Scan Input (I);

said second input of said third AND-INVERT circuit and said second input of said fourth AND-INVERT circuit being connected in common to said A-Clock input;

a second INVERTER circuit having an input and an output, said input of said second INVERTER circuit being connected to said Scan Input (I) and said output of said second INVERT circuit being connected to said first input of said fourth AND-INVERT circuit;

said first input of said ninth AND-INVERT circuit being connected to said output of said third AND-INVERT circuit;

said second input of said ninth AND-INVERT circuit being connected to said output of said first AND-INVERT circuit;

said third input of said ninth AND-INVERT circuit being connected to the output of said tenth AND-INVERT circuit;

said first input of said tenth AND-INVERT circuit being connected to said output of said ninth AND-INVERT circuit;

said second input of said tenth AND-INVERT circuit being connected to said output of said second AND-INVERT circuit;

said third input of said tenth AND-INVERT circuit being connected to said output of said fourth AND-INVERT circuit;

said first input of said seventh AND-INVERT circuit being connected to said System Data Input (D*);

said second input of said seventh AND-INVERT circuit and said second input of said eighth AND-INVERT circuit being connected in common to said System Clock input (C*);

a third INVERTER circuit having an input and an output, said input of said third INVERTER circuit being connected to said System Data Input (D) and said output of said third INVERTER circuit being connected to said first input of said eighth AND-INVERT circuit;

said first input of said fifth AND-INVERT circuit being connected in common to said output of said ninth AND-INVERT circuit and said true output (+L1) of first DC latch circuit (L1);

said first input of said sixth AND-INVERT circuit being connected to said output of said tenth AND-INVERT circuit;

said second input of said fifth AND-INVERT circuit and said second input of said sixth AND-INVERT circuit being connected in common to said B Clock input;

said first input of said eleventh AND-INVERT circuit being connected to said output of said seventh AND-INVERT circuit;

said second input of said eleventh AND-INVERT circuit being connected to said output of said fifth AND-INVERT circuit;

said third input of said eleventh AND-INVERT circuit being connected to said output of said twelfth AND-INVERT circuit;

said first input of said twelfth AND-INVERT circuit being connected in common to the output of said eleventh AND-INVERT circuit and the true output (+L2) of said second DC latch (L2*);

said second input of said twelfth AND-INVERT circuit being connected to the output of said sixth AND-INVERT circuit; and said third input of said twelfth AND-INVERT circuit being connected to said output of said eighth AND-INVERT circuit.

6. An integrated circuit packaging structure, as recited in claim 4, wherein each of said n additional circuit means includes a passive connection means connecting in common at least the system clock C* input of each CPA data port of each of said certain second DC latches (L2*) having a CPA data port on a predetermined chip and a predetermined contact of said plurality of widely spaced apart contacts contained on said second planar surface of said substrate.

7. In a packaging structure for containing and interconnecting one, two, three . . . to n, integrated circuit chips, where n is a positive integer, said packaging structure comprising:

wiring means including a plurality of accessible packaging structure contacts, said wiring means further including wiring for providing electrical signals and energy, such as input, output, power and timing signals, to the integrated circuits on said integrated circuit chips;

each chip of said n integrated circuit chips including at least one CPA shift register latch circuit;

each said CPA shift register latch circuit including a scan input, a scan output, a first latch circuit and a second latch circuit, said first and said second latch circuits of each of said CPA shift register latch circuits being serially connected between said scan input and said scan output thereof, each said first latch circuit of each of said CPA shift register latch circuits further including an A-clock input terminal, each of said second latch circuits of each of said CPA shift register latch circuits further including a B-clock input terminal, a system data input terminal D* and a system clock input terminal C*;

each one of said n integrated circuit chips having a chip scan input pad, a chip scan output pad, a chip A-clock input pad, a chip B-clock input pad and a chip system clock CPA pad, each one of said n integrated circuit chips including first interconnection means for serially interconnecting said scan input and scan output of each of said at least one CPA shift register latch circuits contained on said integrated circuit chip serially between said chip scan input pad and said chip scan output pad of said chip, each one of said n integrated circuit chips including second interconnection means for connecting in common said A-clock input terminals of said at least one CPA shift register latch circuits contained on said chip and said chip A-clock input pad of said chip;

each one of said n integrated circuit chips including third interconnection means for connecting in common said B-clock input terminals of said at least one CPA shift register latch circuits contained on said chip and said chip B-clock input pad of said chip;

each one of said n integrated circuit chips including fourth interconnection means for connecting in common said system clock input terminal (C*) of each of said at least one CPA shift register latch circuits contained on said chip and said chip system clock CPA pad;

said wiring means including first wiring for serially interconnecting said chip scan input pads and said chip scan output pads of said n integrated circuit chips, serially in the order recited, between a package scan input contact and a package scan output contact;

said wiring means including an accessible package A clock input contact and second wiring for interconnecting in common said package A-clock input contact and said A-clock input pad of each of said n integrated circuit chips;

said wiring means including an accessible package B clock input contact and third wiring for interconnecting in common said package B-clock input contact and said B-clock input pad of each of said n integrated circuit chips; and said wiring means including an accessible package system clock CPA input contact and fourth wiring for interconnecting in common said package system clock CPA input contact and said chip system clock CPA input pad of each of said n integrated circuit chips.

8. In a packaging structure for containing and interconnecting one, two, three . . . through n integrated circuit chips, where n is a positive integer, as recited in claim 7, wherein each of said integrated circuit chips has at least one on chip receiver circuit having an off chip input and an on chip output and wherein said output of said at least one on chip receiver circuit is connected to said system data input terminal D* of said at least one CPA shift register latch circuit contained on said same chip as said at least one on chip receiver circuit.

9. An improved high density packaging structure including a plurality of interconnected integrated circuit chips, said packaging structure including circuitry whereby each of said plurality of interconnected integrated circuit chips may be independently tested while remaining interconnected in said packaging structure, and said independent testing of each of said integrated circuit chips is accomplished without the use of a precision probe and a high step and repeat mechanism, said improved high density packaging structure comprising:

a substrate having a first generally planar surface and a second generally planar surface, said second generally planar surface being spaced from and essentially parallel to said first generally planar surface;

a plurality of spaced apart groups of contact pads contained on said first generally planar surface of said substrate;

a pattern of packaging structure contacts on said second generally planar surface of said substrate;

said packaging structure contacts including a single packaging structure scan in contact, a single packaging structure scan out contact, a discrete single packaging structure CPA system clock contact for each one of said plurality of interconnected integrated circuit chips, a single packaging structure A-clock contact, and a single packaging structure B-clock contact;

a plurality of conductors supported by said substrate and interconnecting said groups of contact pads and said pattern of packaging structure contacts;

a plurality of integrated circuit chips, each chip of said plurality of integrated circuit chips having at least one generally planar surface, each chip of said plurality of integrated circuit chips having a group of contact pads, said group of contacts of each chip of said integrated circuit chips corresponding to at least one group of contacts of said substrate;

connection means connecting the group of contacts of each chip to a corresponding predetermined group of contacts of said substrate;

each chip of said plurality of integrated circuit chips containing shift register latch circuit means having at least one shift register latch having an L1 latch and an L2* latch; and said plurality of conductors including conductors for selectively connecting said shift register circuit means having at least one shift register latch having an L1 latch and an L2* latch of each chip of said plurality of integrated circuit chips to said single packaging structure scan in contact, said single packaging structure scan out contact, said single packaging structure A-clock contact, said single packaging structure B-clock contact and said discrete single packing structure CPA system clock contact for each one of said plurality of interconnected integrated circuit chips.

10. An integrated circuit packaging structure, said packaging structure comprising:

a substrate having a first planar surface and a second planar surface oppositely disposed from said first planar surface, said first planar surface containing n arrays of closely spaced contacts, said second planar surface of said substrate containing an array of packaging contacts, said packaging contacts of said array contained on said second planar surface of said substrate being more widely spaced apart, one from another, than said contacts of each of said n arrays of contacts;

passive circuit means contained at least in part in said substrate for interconnecting said contacts of said n arrays contained on said first planar surface of said substrate and said contacts of said array of contacts contained on said second planar surface of said substrate;

n integrated circuit chips, each of said n integrated circuit chips including at least one CPA-SCL1 input terminal, at least one CPA-SCL2* input terminal, at least first and second non-clock chip input terminals, at least one clock chip input terminal, at least first and second non-clock chip output terminals, and at least one clock chip output terminal, each of said n integrated circuit chips including at least first, second, third, fourth and fifth on chip receiver circuits, each of said receiver circuits having an input for receiving an input from off chip and an output, said input of said first receiver circuit being connected to said CPA-SCL1 input terminal, said input of second receiver circuit being connected to said first non-clock chip input terminal, said input of said third receiver circuit being connected to said CPA-L2* chip input terminal, said input terminal of said fourth receiver circuit being connected to said second non-clock chip input terminal, and said input of said fifth receiver circuit being connected to said clock chip input terminal;

each of said n integrated circuit chips including internal logic circuit means, each said logical circuit means having at least first, second and third inputs and each said logic circuit means including at least first, second and third outputs;

each of said n integrated circuit chips including at least first, second and third off-chip driver circuits, each of said at least first, second and third off-chip driver circuits having an input and an output, said output of said first driver circuit being connected to said first non-clock chip output terminal, said output of said second driver circuit being connected to said second non-clock chip output terminal and said output of said third driver circuit being connected to said clock chip output terminal;

each of said n integrated circuit chips including scan-in scan-out circuit means, said scan-in scan-out circuit means of each of said n integrated chips having a chip scan input a chip scan output and chip scan control means, said scan-in scan-out circuit means of each of said n integrated circuit chips including a plurality of serially connected shift register latch circuits connected between said scan input and scan output of said chip, said plurality of serially connected shift register latch circuits of each of said n interconnected integrated circuit chips including at least first, second, third and fourth shift register latch circuits, at least first and second L2* latch circuits and at least first and second L1 latch circuits, said first shift register latch circuit having a clock input connected to said output of said first receiver circuit, said second shift register latch circuit having a clock input connected to said output of said third receiver circuit, said third shift register latch circuit having a clock input connected to said output of said fifth receiver circuit, said first L2* latch circuit having a data input connected to said output of said second receiver circuit and a clock input connected to said output of said third receiver circuit, said second L2* latch circuit having a data input connected to said fourth receiver circuit and a clock input connected to output of said third receiver circuit, said first L2* latch circuit having an output connected to said first input of said internal logic circuit means, said second L2* latch circuit means having an output connected to said second input of said internal logic circuit means, said third input of said internal logic circuit being connected to said output of said fifth receiver circuit, said first L1 latch circuit means having a clock input connected to said output of said first receiver circuit, a data input connected to said first output of said internal logic circuit and an output connected to said input of said first driver circuit, said second L1 latch circuit having a clock input connected to said output of said first receiver circuit, a data input connected to said second output of said internal logic circuit and an output connected to said input of said second driver circuit, said input of said third driver circuit being connected to said third output of said internal logic circuit;

each of said n integrated circuit chips having a first planar surface and a second planar surface oppositely disposed from said first planar surface, each of said n integrated circuit chips having an array of terminals on said first planar surface thereof, said array of terminals of each of said n integrated circuit chips including said at least one CPA-SCL1 input terminal, said at least one CPA-L2* input terminal, said at least first and second non-clock chip input terminals, said at least one clock chip input terminal, said at least first and second non-clock chip output terminals and said at least one clock chip output terminal, said array of terminals of each of said n integrated circuit chips respectively corresponding to, and electrically connected to one of said n arrays of contacts contained on said first planar surface of said substrate, each of said n arrays of terminals on said chips providing electrical contact to the integrated circuits on said chip;

said passive circuit means including first wiring for connecting in common said CPA-SCL1 input terminal of each of said n integrated circuit chips and a CPA-SCL1 packaging contact, second wiring means for connecting in common said CPA-SCL2* input terminals and a CPA-SCL2* packaging contact, third wiring means for serially connecting said scan input and said scan output of each of said n integrated circuits between a scan input packaging contact and a scan output packaging contact, and fourth wiring means for connecting said chip scan control means of each of said n integrated circuit chips and at least first and second packaging contacts.

11. An integrated circuit packaging structure, as recited in claim 10 wherein said first and second packaging contacts are respectively adapted to receive an A-clock pulse and a B-clock pulse and via said chip scan control means of each of said n integrated circuit chips, said A-clock pulses and B-clock pulses are applied to said scan-in scan-out circuit means of each of said n integrated circuit chips.

12. In a high density electronic packaging structure containing at least first, second, third and fourth integrated circuit chips, said packaging structure comprising:
   an array of package contacts, said array of package contacts including a first package CPA-SCL1 contact, a second package CPA-SCL1 contact, a third package CPA-SCL1 contact, a fourth package CPA-SCL1 contact, an A-clock package contact, a B-clock package contact, a Scan-In package contact and a Scan-out package contact;
   at least first, second, third and fourth integrated circuit chips, each of said integrated circuit chips including, an array of chip contacts, said array of chip contacts including
   a chip CPA-SCL1 contact, a chip A clock contact, a chip B clock contact, a chip Scan-in contact and a chip scan-out contact,
   each of said integrated circuit chips including logic circuit means having at least first and second outputs and at least first and second off chip driver circuits each having an input, and an output,
   each of said integrated circuit chips having scan circuit means, said scan circuit means having an input connected to said chip scan-in contact and an output connected to said chip scan-out contact, said scan circuit means of each of said integrated circuit chips comprising a plurality of serially connected shift register latch circuits, each shift register latch circuit having an L1 latch and an L2 latch, said chip A-clock contact being connected to said scan circuit means, said chip B-clock contact being connected to scan circuit means,
   said scan circuit means of each of said integrated circuit chips having a first L1 latch and a second L1 latch, said first and second L1 latches each having an input, an output and a clock input, said first L1 latch having its input connected to said first output of said logic circuit means, said first L1 latch having its output connected to said input of said first off chip driver circuit and said first L1 latch circuit having its clock input connected to said chip CPA-SCL1 contact, said second L1 latch having its input connected to said second output of said logic circuit means, said second L1 latch circuit having its output connected to said input of said second off chip driver circuit and said second L1 latch having its clock connected input to said chip CPA-SCL1 contact,
   package wiring means for interconnecting said array of package contacts and said array of chip contacts of each said at least first, second, third and fourth integrated circuit chips, said package wiring means including means for connecting, said package scan-in contact to said chip scan-in contact of said first integrated circuit chip, said chip scan-out contact of said first chip to said chip scan-in contact of said second chip, said chip scan-out contact of said second chip to said chip scan-in contact of said third chip, said chip scan-out contact of said third chip to said chip scan-in contact of said fourth chip, said chip scan-out contact of said fourth chip to said package scan-out contact, said first package CPA-SCL1 contact to said chip CPA-SCL1 contact of said first integrated circuit chip, said second package CPA-SCL1 contact to said chip CPA-SCL1 contact of second integrated circuit chip, said third package CPA-SCL1 contact to said chip CPA-SCL1 contact of said third integrated circuit chip, said fourth package CPA-SCL1 contact to said chip CPA-SCL1 contact of said fourth integrated circuit chip, said A- clock package contact in common to said chip A- clock contact of each of said first, second, third and fourth integrated circuit chips and said B- clock package contact in common to said chip B-clock contact of each of said first, second, third and fourth integrated circuit chips.

13. In a high density electronic packaging structure containing at least first, second, third and fourth integrated circuit chips, as recited in claim 12, wherein said packaging structure includes a multilayer ceramic substrate containing internal wiring, a first planar surface of said substrate containing said array of packaging contacts, a second planar surface of said substrate containing said array of chip contacts of each of said first, second, third and fourth integrated circuit chips and said package wiring means includes said internal wiring of said multi-layer ceramic substrate.

14. In a high density electronic packaging structure, as recited in claim 11 or 12, wherein said array of packaging contacts is an array of contact pins.

15. In a high density electronic packaging structure, as recited in claim 11, wherein said packaging structure includes a generally planar substrate and where said array of packaging contacts are edge connectors on said planar substrate.

16. In a high density electronic packaging structure containing at least first, second, third and fourth integrated circuit chips, said packaging structure comprising:
   an array of package contacts, said array of package contacts including a CPA-SCL1 package contact, a CPA-SCL2* package contact, an A- clock package contact, a B- clock package contact, a scan-in package contact and a scan-out package contact;
   at least first, second, third and fourth integrated circuit chips, each of said integrated circuit chips including a CPA-SCL1 chip contact, a CPA-SCL2* chip contact, an A- clock chip contact, a B- clock chip contact, a scan-in chip contact, and a scan-out chip contact,
   each of said integrated circuits including logic circuit means having at least first and second inputs and at least first and second outputs, at least first and second receiver circuits, each of said receiver circuits having an input and an output, at least first and second off-chip driver circuits, each of driver circuits having an input and an output, each of said integrated circuit chips having scan circuit means, said scan circuit means having an input connected to said scan-in chip contact and an output connected to said scan-out chip contact, said scan circuit means of each of said integrated circuit chips comprising a plurality of serially connected shift register latch circuits, at least first and second ones of said plurality of shift register latch circuits, each having an L1 latch and an L2* latch said remaining ones of said shift register latch circuits of said plurality of shift register latch circuits each having an L1 latch and an L2 latch, said A-clock chip contact being connected to said scan circuit means and said B- clock chip contact being connected to said scan circuit means, said scan circuit means of each of said integrated circuit chips having a first L1 latch and a second L1 latch, said first and second L1 latches each having an input, an output and a clock input, said first L1 latch having its input connected to said first output of said logic circuit means, said first L1 latch having its output connected to said input of said first off-chip driver circuit, said first L1 latch having its clock input connected to said CPA-SCL1 chip contact, said second L1 latch having its input connected to said second output of said logic circuit means, said second L1 latch circuit having its output connected to said input of said second off chip driver circuit, and said second L1 latch having its clock input connected to said CPA-SCL1 chip contact, said scan circuit means of each of said integrated circuit chips having said first L2* latch and said second L2* latch, each of said first and second L2* latches having an input, an output and a C* clock input, said input of said first L2* latch circuit being connected to said output of said first receiver circuit, said output of said first L2* latch circuit being connected to said first input of said logic circuit means, said input of said second L2* latch circuit being connected to said output of said first receiver circuit, said output of said second L2* latch circuit being connected to said second input of said logic circuits, said C* clock input of said first L2* latch circuit and said C* clock input of said second L2* latch circuit being connected in common to said CPA-SCL2* chip contact, packaging wiring means for interconnecting said array of package contacts and said array of chip contacts of each said at least first, second, third and fourth integrated circuit chips, said package wiring means including means for connecting said package scan in contact to said chip scan-in contact of said first integrated circuit chip, said chip scan-out contact of said first chip to said chip scan-in contact of said second chip, said chip scan-out contact of said second chip to said chip scan-in contact of said third chip, said chip scan-out contact of said third chip to said chip scan-in contact of said fourth chip, said chip scan-out contact of said fourth-chip to said package scan-out contact, said A-clock package contact in common to said A-clock chip contact of each of said integrated circuit chips, said B-clock package contact in common to said B-clock chip contact of each of said integrated circuit chips, said CPA-SCL1 package contact in common to said CPA-SCL1 chip contact of each of said integrated circuit chips, and said CPA-SCL2* package contact to said CPA-SCL2* chip contact of each of said integrated circuit chips.

17. In a high density electronic packaging structure containing at least first, second, third and fourth integrated circuit chips, as recited in claim 16, wherein said packaging structure includes a multilayer ceramic substrate containing internal wiring, a first planar surface of said substrate containing said array of packaging contacts, a second planar surface of said substrate containing said array of chip contacts of each of said first, second, third and fourth integrated circuit chips and said package wiring means includes said internal wiring of said multilayer ceramic substrate.

18. In a high density electronic packaging structure, as recited in claim 16 or 17, wherein said array of packaging contacts is an array of contact pins.

19. In a high density electronic packaging structure, as recited in claim 16, wherein said packaging structure includes a generally planar substrate and where said array of packaging contacts are edge connectors on said planar substrate.

* * * * *